(12) United States Patent
Toba et al.

(10) Patent No.: US 7,745,288 B2
(45) Date of Patent: Jun. 29, 2010

(54) SEMICONDUCTOR DEVICE AND A METHOD OF MANUFACTURING THE SAME

(75) Inventors: Koichi Toba, Tokyo (JP); Yasushi Ishii, Tokyo (JP); Yoshiyuki Kawashima, Tokyo (JP); Satoru Machida, Tokyo (JP); Munekatsu Nakagawa, Tokyo (JP); Kentaro Saito, Tokyo (JP); Toshikazu Matsui, Tokyo (JP); Takashi Hashimoto, Tokyo (JP); Kosuke Okuyama, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 65 days.

(21) Appl. No.: 11/717,053

(22) Filed: Mar. 13, 2007

(65) Prior Publication Data

US 2007/0228446 A1    Oct. 4, 2007

(30) Foreign Application Priority Data

Apr. 4, 2006    (JP)    .............................. 2006-103463

(51) Int. Cl.
*H01L 21/336*    (2006.01)

(52) U.S. Cl. ...................... 438/264; 438/596; 438/257; 438/593

(58) Field of Classification Search ................ 438/596, 438/264, 257, 593
See application file for complete search history.

(56) References Cited

U.S. PATENT DOCUMENTS 5,064,776 A * 11/1991 Roberts ...................... 438/304
2006/0008992 A1 * 1/2006 Shukuri ...................... 438/264

FOREIGN PATENT DOCUMENTS

| JP | 2002-198523 A | 7/2002 |
| JP | 2004-079893 A | 3/2004 |
| JP | 2004-266203 A | 9/2004 |

* cited by examiner

*Primary Examiner*—Thanh V Pham
*Assistant Examiner*—Caleb Henry
(74) *Attorney, Agent, or Firm*—Miles & Stockbridge P.C.

(57) ABSTRACT

A semiconductor device having a non-volatile memory is disclosed, whose disturb defect can be diminished or prevented. A memory cell of the non-volatile memory has a memory gate electrode formed over a main surface of a semiconductor substrate through an insulating film for charge storage. A first side wall is formed on a side face of the memory gate electrode, and at a side face of the first side wall, a second side wall is formed. On an upper surface of an $n^+$-type semiconductor region for source in the memory cell there is formed a silicide layer whose end portion on the memory gate electrode MG side is defined by the second side wall.

6 Claims, 23 Drawing Sheets

SEMICONDUCTOR DEVICE AND A METHOD OF MANUFACTURING THE SAME

CROSS-REFERENCE TO RELATED APPLICATIONS

The disclosure of Japanese Patent Application No. 2006-103463 filed on Apr. 4, 2006 including the specification, drawings and abstract is incorporated herein by reference in its entirety.

BACKGROUND OF THE INVENTION

The present invention relates to a semiconductor device and a manufacturing technique for the same. Particularly, the present invention is concerned with a technique applicable effectively to a semiconductor device having a non-volatile memory and a method of manufacturing the same.

Electrically erasable programmable non-volatile memories such as EEPROM (Electrically Erasable Programmable Read Only Memory) and flash memory permit onboard rewriting of programs, thus permitting shortening of the development period and improvement of the development efficiency. Therefore, the application thereof is spreading to various uses, including the use in multifarious small-lot production, tuning by destinations, and program updating after shipping.

As an electrically erasable programmable non-volatile memory there mainly is used EEPROM using the ordinary polysilicon as a floating electrode. Recently, attention has been paid to an MNOS (Metal Nitride Oxide Semiconductor) structure using a nitride film (silicon nitride (e.g. $Si_3N_4$)) as a charge storage layer or an MONOS (Metal Oxide Nitride Oxide Semiconductor) structure. In this case, the electric charge which contributes to the storage of data is accumulated in a discrete trap of a nitride film which is an insulator, so that even if there occurs a defect in any part of an oxide film which surrounds an accumulation node, with consequent occurrence of abnormal leakage, there is no fear of complete removal of the electric charge on the charge storage layer. Thus, it is possible to improve the data holding reliability.

In connection with the configuration of a memory cell there has been proposed a memory cell of a single transistor structure. As a write/erase method there has been proposed not only a method wherein write is performed by full surface FN (Fowler Nordheim) tunneling injection from a semiconductor substrate and erasing is performed by FN tunneling current to the semiconductor substrate, but also a method wherein erasing is performed by FN tunneling current to a semiconductor substrate or to the source and drain regions. Further, in the case of a MONOS type single transistor cell structure, it is apt to be influenced by disturb in comparison with the EEPROM cell structure. In view of this point there also has been proposed a split gate type memory cell structure of a two-transistor configuration provided with a control gate electrode.

As to the split gate type memory cell of such a two-transistor configuration, a description is found in for example Japanese patent laid-open No. 2004-266203 (see Patent Literature 1). In Patent Literature 1 is disclosed a non-volatile memory cell configuration having a first electrode formed on a semiconductor substrate via a gate insulating film for charge storage, a second gate electrode formed on the semiconductor substrate via a gate insulating film in adjacency to the first gate electrode, and semiconductor regions for source and drain formed on both-side semiconductor substrate portions in the direction of arrangement of the first and second gate electrodes.

Moreover, for example in Japanese patent laid-open No. 2002-198523 (see Patent Literature 2) there is disclosed a technique of forming semiconductor regions for source and drain using as a mask a first side wall formed on a side wall of a gate electrode of MISFET, then forming a second side wall on a side wall of the first side wall and, using the second side wall as a mask, forming a silicide layer on each of the semiconductor regions for source and drain.

Further, for example in paragraphs [0050] and [0051] of Japanese patent laid-open No. 2004-079893 (see Patent Literature 3) there is disclosed a technique wherein, at the time of forming a side wall on a side face of a gate electrode, a pattern of an insulating film permitting exposure of a contact region of a polysilicon resistor is formed on the polysilicon resistor with use of an insulating film for forming the side wall.

[Patent Literature 1]
Japanese patent laid-open No. 2004-266203
[Patent Literature 2]
Japanese patent laid-open No. 2002-198523
[Patent Literature 3]
Japanese patent laid-open No. 2004-079893 (paragraphs [0050] and [0051])

SUMMARY OF THE INVENTION

However, the semiconductor device having a non-volatile memory involves the problem that a threshold value of a bit in an erased state increases contrary to intention, that is, a so-called disturb defect (erroneous write after erasing operation) is apt to occur.

Having studied the aforesaid disturb defect, the present inventors found out that the leakage current occurring in the non-volatile memory cell contributes markedly to a disturb defect. More on this will be described below.

In the non-volatile memory cell which the present inventors have studied, a memory gate electrode is formed on a main surface of a semiconductor substrate via an insulating film for charge storage and a side wall is formed on one side face of the memory gate electrode. A semiconductor region on a low concentration side for source is formed on the main surface of the semiconductor substrate self-alignmentwise for the one side face of the memory gate electrode. Also, a semiconductor region on a high concentration side for source is formed on the main surface of the semiconductor substrate self-alignmentwise for the side face of the aforesaid side wall so as to be coupled electrically to the low concentration-side semiconductor region for source. Further, a silicide layer is formed on the high concentration-side semiconductor region.

According to this configuration, since the memory gate electrode-side end portion of the silicide layer is formed self-alignmentwise to the side face of the side wall, it becomes close to a junction surface of the high concentration-side semiconductor region for source. Particularly, according to a study made by the present inventors, when forming the side wall on the side face of the memory gate electrode, the main surface of the semiconductor substrate on the source side is somewhat shaved and depressed, but since a silicide layer is formed on the depressed surface, the memory gate electrode-side end portion of the silicide layer becomes closer to the junction surface of the high concentration-side semiconductor region for source.

Consequently, a leakage current is apt to flow downwards of the low concentration-side semiconductor region for source from the end portion of the silicide layer. It turned out that with this leakage current, hot electrons were produced in the semiconductor substrate portion located below the insulating film for charge storage and injected into the same insulating film, thus resulting in increase of the threshold value of the non-volatile memory contrary to intention.

Accordingly, it is an object of the present invention to provide a technique able to diminish or prevent a disturb defect of a semiconductor device having a non-volatile memory.

The above and other objects and novel features of the present invention will become apparent from the following description and the accompanying drawings.

The following is a brief description of a typical mode of the present invention as disclosed herein.

According to the present invention there is provided a non-volatile memory having a gate electrode over a main surface of a semiconductor substrate via an insulating film for charge storage, the non-volatile memory comprising a first insulating film formed over a side face of the gate electrode, semiconductor regions for source and drain formed over the semiconductor substrate self-alignmentwise for side faces of the first insulating film, a second insulating film formed over a side face of the first insulating film, and silicide layers formed over the semiconductor regions for source and drain.

The following is a brief description of an effect obtained by the typical mode of the present invention as disclosed herein.

In the non-volatile memory cell according to the present invention having a gate electrode formed over the main surface of the semiconductor substrate via an insulating film for charge storage, since a silicide layer can be formed over a side face of the gate electrode at a position spaced a distance corresponding to the thickness of the second insulating film away from a side face of the first insulating film, it is possible to diminish or prevent a disturb defect of a semiconductor device having the non-volatile memory.

DETAILED DESCRIPTION OF THE PREFERRED EMBODIMENT

Figure 1:
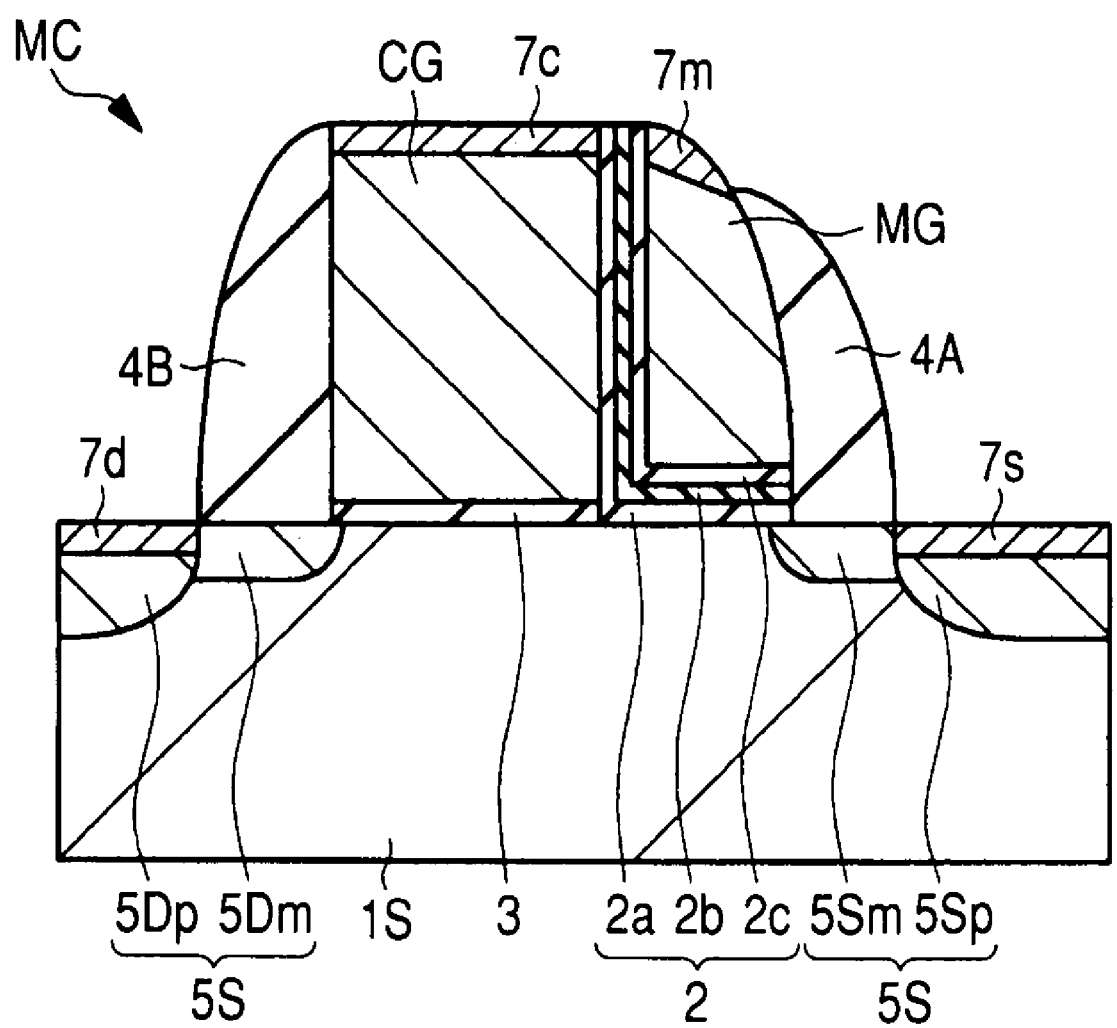
FIG. 1 is a sectional view of a non-volatile memory cell which the present inventors have studied.

Where required for convenience' sake, the following embodiment will be described in a divided manner into plural sections or embodiments, but unless otherwise mentioned, they are not unrelated to each other, but are in a relation such that one is a modification, a description of details, or a supplementary explanation, of part or the whole of the other. In the following embodiment, when reference is made to the number of elements (including the number, numerical value, quantity, and range), no limitation is made to the number referred to, but numerals above and below the number referred to will do as well unless otherwise mentioned and except the case where it is basically evident that limitation is made to the number referred to. In the following embodiment, it goes without saying that their components (including constituent steps) are not always essential unless otherwise mentioned and except the case where they are considered essential basically clearly. Likewise, in the following embodiment, it is to be understood that when reference is made to the shape and positional relation of a component, those substantially similar or closely similar thereto are also included unless otherwise mentioned and except the case where the answer is negative basically clearly. This is also true of the foregoing numerical value and range. In all of the drawings for illustrating the embodiment, portions having the same functions are identified by like reference numerals, and repeated explanations will be omitted where possible. The embodiment of the present invention will be described hereinunder with reference to the accompanying drawings.

First Embodiment

A description will be given first about problems which the present inventors found out for the first time.

The semiconductor device which the present inventors have studied is a semiconductor device having a non-volatile memory such EEPROM or flash memory. Each of plural memory cells which constitute the non-volatile memory is formed as a split gate type memory cell of a two-transistor configuration for example. One of the two transistors is a transistor of MONOS (Metal Oxide Nitride Oxide Semiconductor) structure having a nitride film (e.g., silicon nitride film) as a charge storage layer for the storage of data. In the MONOS structure, since a single transistor structure is apt to be influenced by deplete, there is adopted a split gate type memory cell of a two-transistor configuration in order to avoid such influence.

Figure 2:
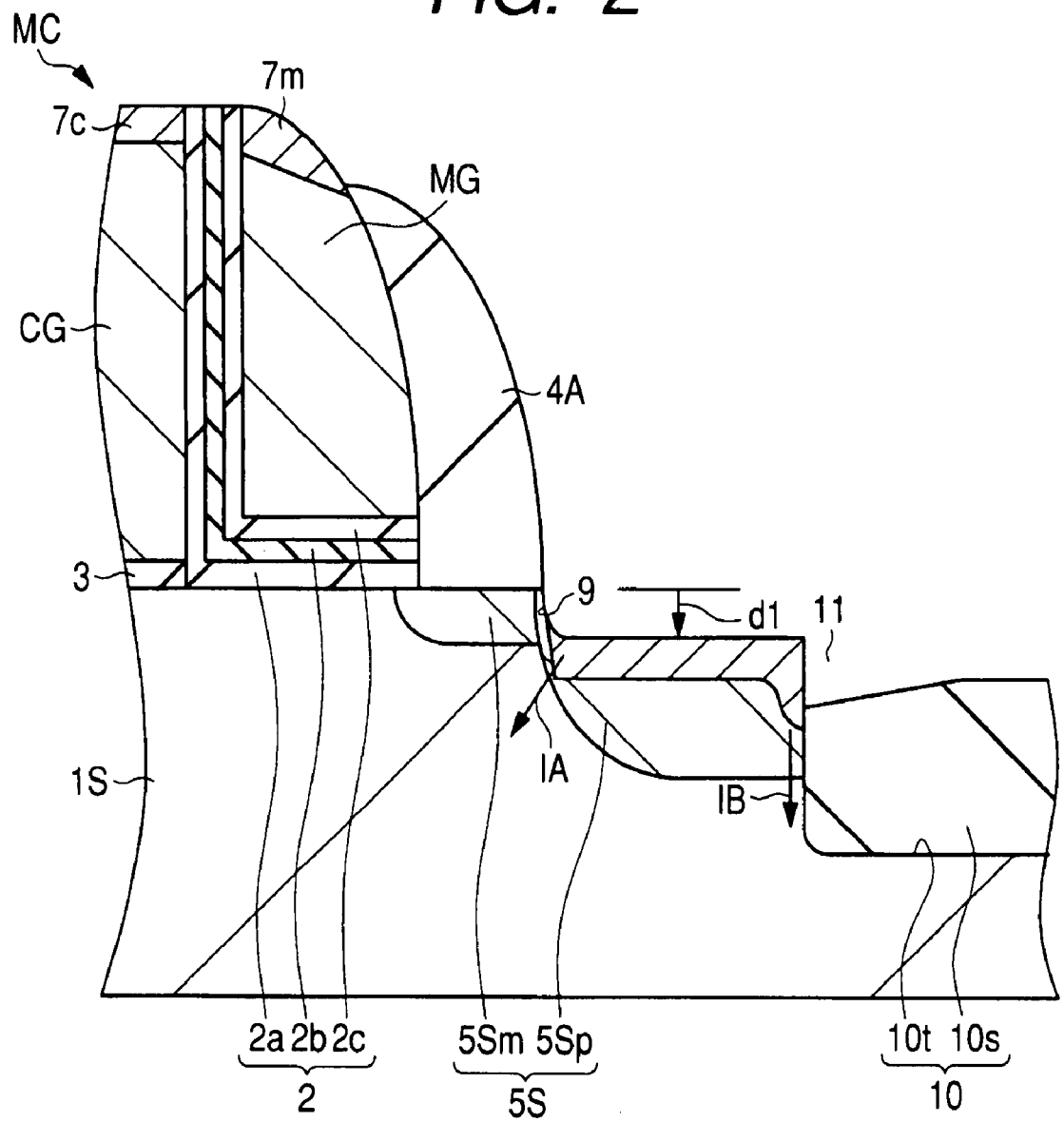
FIG. 2 is an enlarged sectional view of a principal portion of the memory cell shown in FIG. 1.

FIG. 1 is a sectional view of a non-volatile memory cell MC which the present inventors have studied and FIG. 2 is an enlarged sectional view of a principal portion of the memory cell MC.

A semiconductor substrate 1S is formed of a p-type silicon single crystal for example and a split gate type memory cell MC of a non-volatile memory is disposed over a main surface (device-forming surface) of the semiconductor substrate 1S. The memory cell MC has two gate electrodes which are a memory gate electrode (first gate electrode) MG and a control gate-electrode (second gate electrode) CG.

The memory gate electrode MG is constituted by polycrystalline silicon of a low resistance for example and is formed on the main surface of the semiconductor substrate 1S via an insulating film 2 for charge storage. The insulating film 2 for charge storage is a portion corresponding to the foregoing charge storage layer and is formed by stacking for example three insulating films 2a, 2b and 2c in this order. Outside insulating films 2a and 2c are formed by silicon oxide (e.g., $SiO_2$) for example. The insulating film 2b sandwiched in between the two insulating films 2a and 2c is formed by silicon nitride (e.g., $Si_3N_4$) for example. An electric charge which contributes to the storage of data is accumulated in a discrete trap of the insulating film 2b out of the three insulating films 2a to 2c. Therefore, even if there occurs a defect in any part of an oxide film which surrounds an accumulation node, with consequent occurrence of abnormal leakage, there is no fear of complete removal of the electric charge on the charge storage layer, thus making it possible to improve the reliability of data holding.

The control gate electrode CG is constituted by polycrystalline silicon of a low resistance for example and is formed on the main surface of the semiconductor substrate 1S via a gate insulating film 3. The gate insulating film 3 is formed of silicon oxide for example.

The memory gate electrode MG and the control gate electrode CG are disposed side by side on the main surface of the semiconductor substrate 1S with the insulating film 2 for charge storage interposed between the opposed side faces of the electrodes MG and CG. On the other side faces of the memory gate electrode MG and the control gate electrode CG there are formed side walls 4A (first insulating film (first side wall)) and 4B (third insulating film (third side wall)), respectively. For example, the side walls 4A and 4B are formed of silicon oxide.

The memory cell MC has a semiconductor region 5S for source and a semiconductor region 5D of drain. The control gate electrode CG and the memory gate electrode MG are disposed between the semiconductor region 5S for source and the semiconductor region 5D for drain.

The semiconductor region 5S for source has an $n^-$-type semiconductor region (first semiconductor region) 5Sm and an $n^+$-type semiconductor region (second semiconductor region) 5Sp. The $n^-$-type semiconductor region 5Sm and the $n^+$-type semiconductor region 5Sp are electrically coupled with each other. The impurity concentration in the $n^-$-type semiconductor region 5Sm is set lower than that in the $n^+$-type semiconductor region 5Sp. The $n^-$-type semiconductor region 5Sm is formed self-alignmentwise for a side face of the memory gate electrode MG. On the other hand, the $n^+$-type semiconductor region 5Sp is formed self-alignmentwise for a side face of the side wall 4A and is positioned away from the memory gate electrode MG with respect to the $n^-$-type semiconductor region 5Sm.

The semiconductor region 5D for drain has an $n^-$-type semiconductor region (third semiconductor region) 5Dm and an $n^+$-type semiconductor region (fourth semiconductor region) 5Dp. The $n^-$-type semiconductor region 5Dm and the $n^+$-type semiconductor region 5Dp are electrically coupled with each other. The impurity concentration in the $n^-$-type semiconductor region 5Dm is set lower than that in the $n^+$-type semiconductor region 5Dp. The $n^-$-type semiconductor region 5Dm is formed self-alignmentwise for a side face of the control gate electrode CG. On the other hand, the $n^+$-type semiconductor region 5Dp is formed selfalignmentwise for a side face of the side wall 4B and is positioned away from the control gate electrode CG with respect to the $n^-$-type semiconductor region 5Dm.

Silicide layers 7m, 7c, 7s, and 7d such as, for example, cobalt silicide ($CoSi_2$) layers are formed on upper surfaces of the memory gate MG, the control gate electrode CG, the $n^+$-type semiconductor region 5Sp for source, and the $n^+$-type semiconductor region 5Dp for drain, respectively, in the memory cell MC constructed as above. The silicide layers 7s and 7d on the upper surfaces of the $n^+$-type semiconductor region 5Sp for source and the $n^+$-type semiconductor region 5Dp are formed self-alignmentwise for side faces of the side walls 4A and 4B.

The present inventors have studied a disturb defect (an erroneous write defect such that a threshold value of a bit in an erased state increases contrary to intention) which occurs in the memory cell MC of such a non-volatile memory. As a result, the present inventors found out for the first time that a leakage current produced in the memory cell MC of the non-volatile memory contributed markedly to the disturb defect.

As described above, the silicide layer 7s on the upper surface of the $n^+$-type semiconductor region 5Sp for source is formed self-alignmentwise for a side face of the side wall 4A. On the other hand, the $n^+$-type semiconductor region 5Sp for source is also formed self-alignmentwise for a side face of the side wall 4A. Therefore, the end portion of the silicide layer 7s on the memory gate electrode MG side becomes close to the end portion of the $n^+$-type semiconductor region 5Sp on the memory gate electrode MG side. That is, the end, portion of the silicide layer 7s becomes close to the junction surface between the $n^+$-type semiconductor region 5Sp for source and the semiconductor substrate 1S.

Particularly, according to a study made by the present inventors, as shown in FIG. 2, when forming the side wall 4A on a side face of the memory gate electrode MG, the main surface of the source-side semiconductor substrate 1S is shaved by depth d1 to form a depression 9. That is, the main surface of the semiconductor substrate 1S on the side-face side of the side walls 4A and 4B is depressed lower than the main surface of the semiconductor substrate 1S on which the memory gate electrode MG, the control gate electrode CG and the side walls 4A, 4B are opposed to one another. Consequently, the silicide layer 7s is formed on a side face and an upper surface of the depression 9. As a result, the end portion of the silicide layer 7s on the memory gate electrode MG side becomes closer to the junction surface between the $n^+$-type semiconductor region 5Sp for source and the semiconductor substrate 1S. There sometimes is a case where a convex portion or the like is formed on a lower surface of the silicide layer 7s and reaches the semiconductor substrate 1S beyond the $n^+$-type semiconductor region 5Sp. The reason why convex and concave portions are formed on the bottom of the silicide layer 7s is presumed to be because an impurity or a natural oxide film which remains unremoved in a washing process prior to formation of the silicide layer is present on the surface of the semiconductor substrate 1S and there occur thick and thin portions of the silicide layer correspondingly to whether such impurity or natural oxide film is present or not.

Thus, in the memory cell MC of the above configuration, a leakage current IA is apt to flow from an end portion of the silicide layer 7s formed on the upper surface of the $n^+$-type semiconductor region 5Sp toward the semiconductor substrate 1S which underlies the $n^-$-type semiconductor region 5Sm for source.

In the non-volatile memory the sum total of the drain current during stand-by is smaller one order of magnitude or more than that of the drain current during stand-by of the ordinary MOSFET (Metal Oxide Semiconductor Field Effect Transistor). Or, the source current at the time of rewriting data of memory is smaller than an allowable current of a charge pump. Therefore, the memory cell region of the non-volatile memory, the leakage current itself poses no problem.

However, according to a study made by the present inventors, it turned out that with the leakage current IA flowing from an end portion of the silicide layer 7s on the $n^+$-type semiconductor region 5Sp for source toward the semiconductor substrate 1S underlying the $n^-$-type semiconductor region 5Sm for source, hot electrons were produced in the portion of the semiconductor substrate 1S just under the insulating film 2 for charge storage and were injected into the insulating film 2 for charge storage, resulting in increase of the threshold value of the memory cell MC. That is, erroneous data are written to the insulating film 2b for charge storage of the memory cell MC.

As a solution to such a disturb defect there has been proposed a method wherein an n-type semiconductor region lower in impurity concentration than the $n^+$-type semiconductor region 5Sp is formed deeper at an end portion of the $n^+$-type semiconductor region 5Sp for source. In this case, however, there arises the problem of a short channel effect. As another solution there has been proposed a method of increasing the gate length of the memory gate electrode MG. In this case, however, there arises the problem that the erasing speed decreases. As a further solution there has been proposed a method of increasing the length of the surface of the side wall 4A opposed to the semiconductor substrate 1S. In this case, however, there arises the problem of lowering of the cell current.

In connection with the memory cell MC, the following problems also exist as problems other than the above disturb defect problems. Such a leakage current as referred to above occurs also in the drain-side $n^+$-type semiconductor region 5Dp. That is, the end portion on the control gate electrode CG side of the silicide layer 7d formed on the upper surface of the drain-side $n^+$-type semiconductor region 5Dp becomes close to the end portion on the control gate electrode CG side of the $n^+$-type semiconductor region 5Dp. Consequently, a leakage current is apt to flow from the aforesaid end portion of the silicide layer 7d toward the semiconductor substrate 1S which underlies the $n^-$-type semiconductor region 5Dm for drain. On the drain side, since it is away from the insulating film 2b for charge storage, the foregoing disturb defect problems do not occur, but there arises the problem of erroneous read due to an increase of the leakage current.

In connection with formation of the silicide layer described above, the following problem also exists as a problem other than the above disturb defect problems. As shown in FIG. 2, an element isolation region 10 is formed on the main surface of the semiconductor substrate 1S. An active region is defined by the element isolation region 10 and elements are formed in the active region.

The isolation region 10 is a trench type isolation region called for example STI (Shallow Trench Isolation) or SGI (Shallow Groove Isolation). The isolation region 10 is formed by embedding an insulating film 10s for isolation into an isolation trench 10t formed on the main surface of the semiconductor substrate 1S.

On an upper surface of the insulating film 10s for isolation there may be formed a depression 11 in adjacency to the aforesaid active region. A part of the semiconductor substrate 1S adjacent to a side face of the isolation trench 10t is exposed from the depression 11. In this state, if a conductor film for silicide formation is deposited, allowing a silicide reaction to take place, the silicide reaction proceeds also in the portion of the semiconductor substrate 1S adjacent to the side face of the isolation trench 10t exposed from the depression 11. Accordingly, such a silicide layer 7s as extends in the thickness direction of the semiconductor substrate 1S along the side face of the isolation trench 10t is formed also in the portion of the semiconductor substrate 1S exposed from the depression 11. As a result, a leakage current IB flows in the thickness direction of the semiconductor substrate 1S from the silicide layer 7s, thus giving rise to the problem that the leakage current during stand-by increases and so does the current consumption. This problem arises not only on both source and drain sides of the memory cell MC but also in other element portions.

This embodiment solves the above-mentioned problems. A description will be given below about a concrete example of a semiconductor device having the non-volatile memory according to this embodiment.

Figure 3:
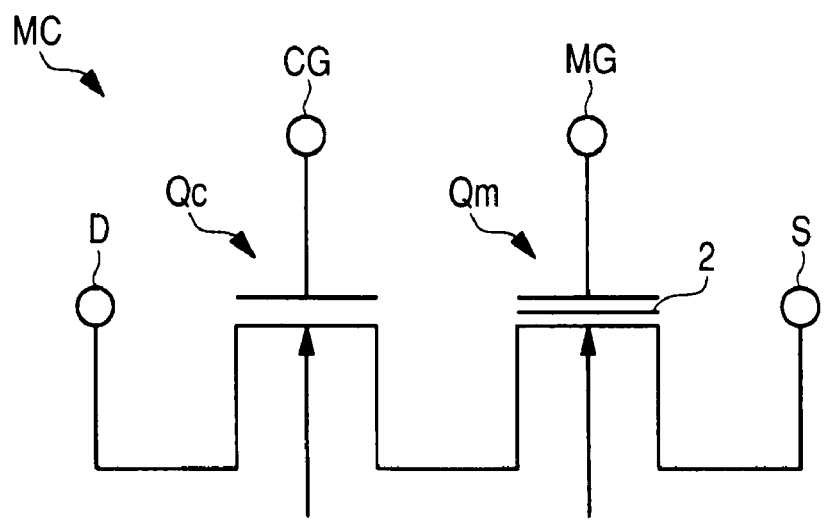
FIG. 3 is a circuit diagram of a memory cell in a semiconductor device having a non-volatile memory according to an embodiment of the present invention.

FIG. 3 is a circuit diagram of the memory cell MC in the non-volatile memory according to this embodiment. The memory cell MC is provided between a drain electrode D and a source electrode S with two transistors, e.g., an n-channel type MISFETQc (hereinafter referred to simply as "nMISQc for selection") for memory cell selection and an n-channel typeMISFETQm (simply as "nMISQm for memory" hereinafter) for data storage.

The nMISQc for selection has a control gate electrode CG, while the nMISQm for memory has a memory gate electrode MG and an insulating film 2 (charge storage layer) for charge storage. The write of data is performed by injecting electrons into the insulating film 2b for charge storage from the semiconductor substrate 1S with use of the hot electron injecting method for example. This method is superior in electron injection efficiency and permits write at high speed and low current.

Erasing of data is performed, for example, by generating hot holes and injecting holes into the insulating film 2b for charge storage. Thus, it is easy to control the write and erase operations and it is possible to simplify (downsize) a power supply circuit and a peripheral circuitry.

For read of data, a desired voltage is applied to the memory gate electrode MG to turn ON the nMISQc for selection in a state in which the potential of the drain electrode D is made higher than that of the source electrode S. At this time, the threshold voltage of nMISQmm for memory changes depending on whether electrons are present or not in the insulating film 2b for charge storage of the nMISQm and a current flow or does not between the drain electrode D and the source electrode S, whereby data are read.

Figure 4:
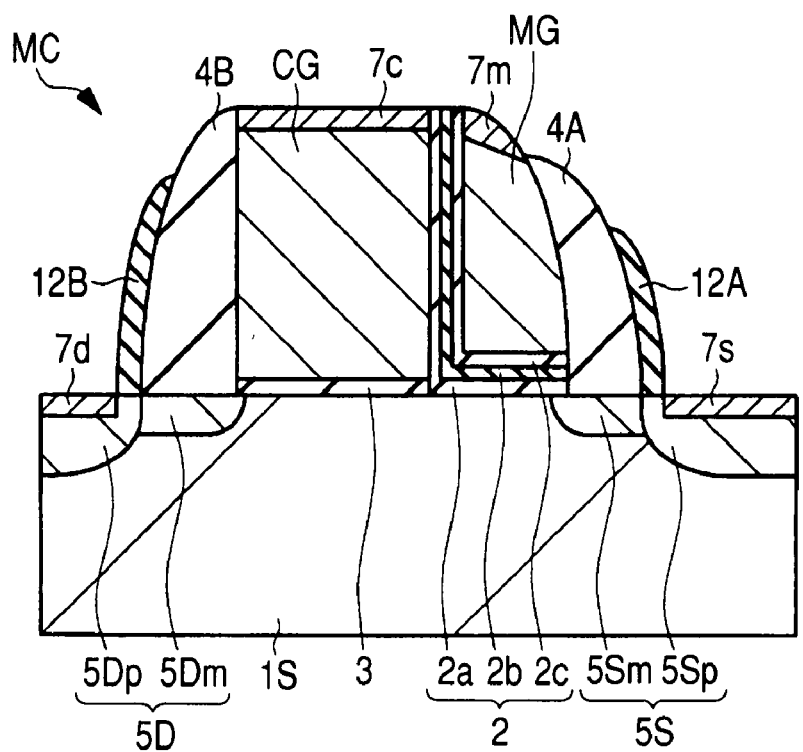
FIG. 4 is a sectional view of a basic device configuration of the memory cell shown in FIG. 3.
Figure 5:
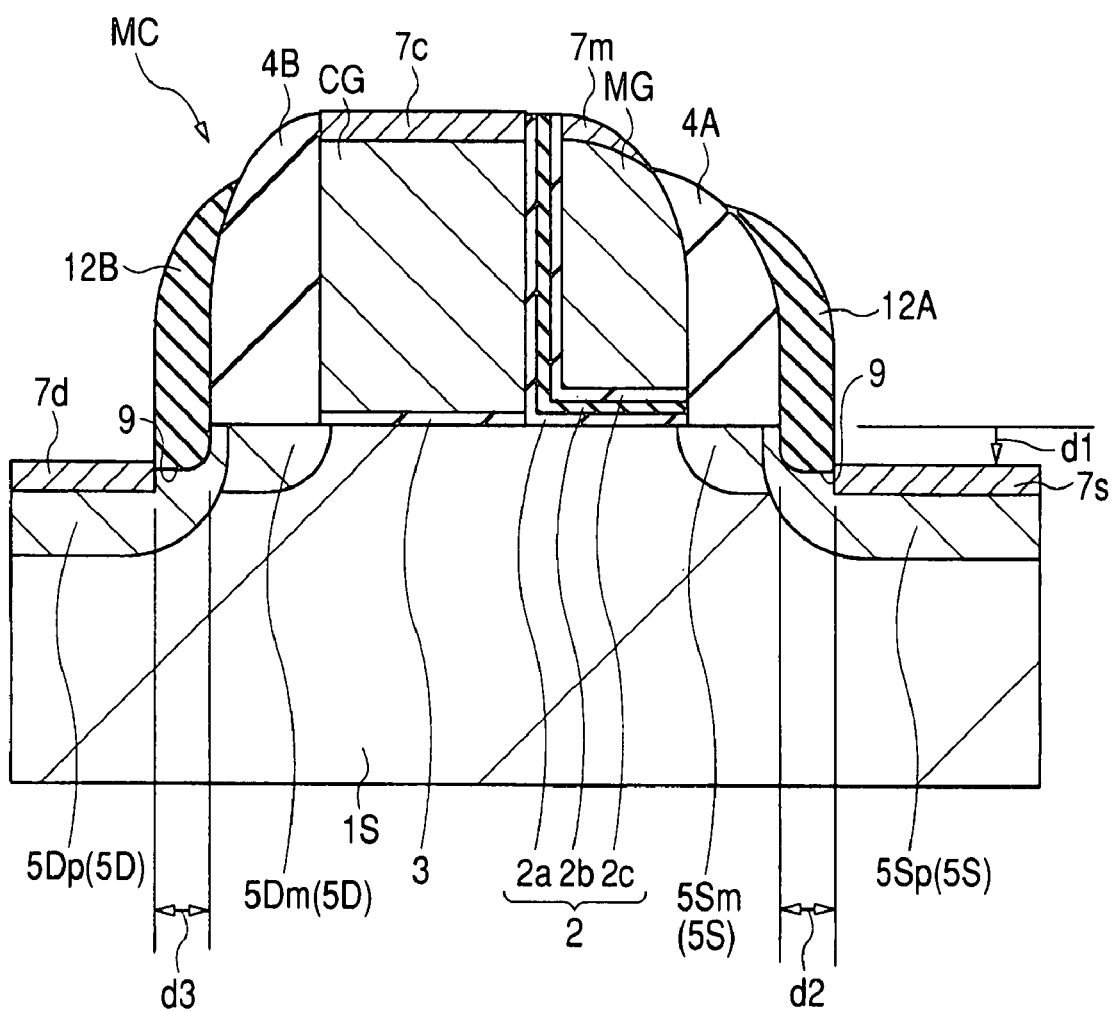
FIG. 5 is an enlarged sectional view of a principal portion of the memory cell shown in FIG. 4.
Figure 6:
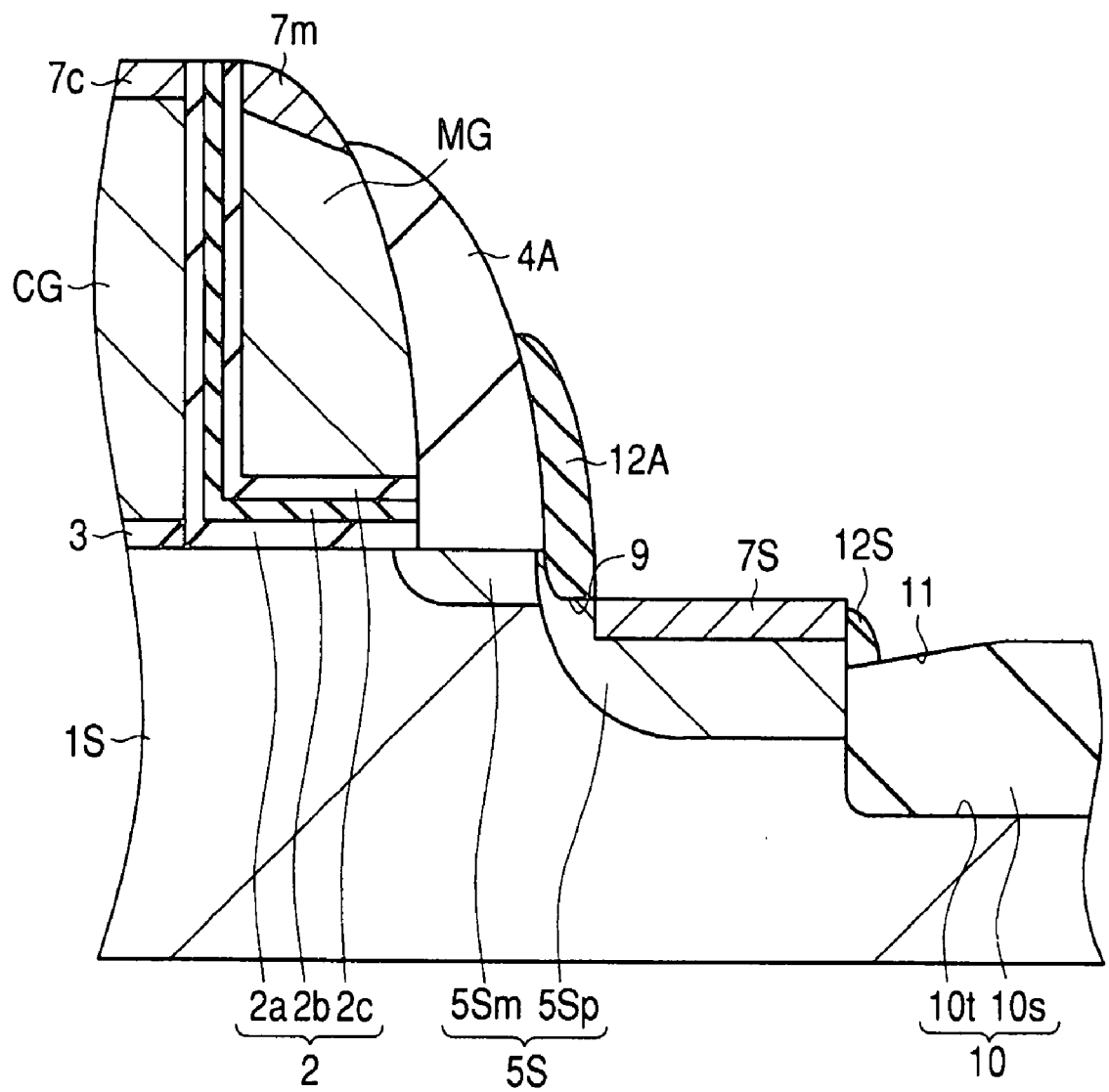
FIG. 6 is an enlarged sectional view of a principal portion of the memory cell shown in FIG. 4.

FIG. 4 is a sectional view showing a basic device configuration of the memory cell MC and FIGS. 5 and 6 each show an example of an enlarged sectional view of a principal portion of the memory cell MC shown in FIG. 4. Since a basic configuration is the same as that described above in connection with FIGS. 1 and 2, explanations of the same portions will be omitted.

In this embodiment, on side faces of the side walls 4A and 4B there are formed side walls (a second insulating film (second side wall) and a fourth insulating film (fourth side wall)) 12A and 12B, the side walls 12A and 12B being formed of the same silicon oxide as that of the side walls 4A and 4B for example. That is, the side faces of the side walls 4A and 4B are covered with the side walls 12A and 12B, respectively.

As shown in FIGS. 5 and 6, depressions 9 are formed in the semiconductor substrate 1S at positions outside the memory gate electrode MG, control gate electrode CG and side walls 4A, 4B. Therefore, the main surface of the semiconductor substrate 1S where the side walls 12A and 12B are opposed to each other is depressed lower than the main surface of the semiconductor substrate 1S where the memory gate electrode MG, control gate electrode CG and side walls 4A, 4B are opposed to one another. Lower end portions of the side walls 12A and 12B cover the edges of contact interfaces between the side walls 4A, 4B and the semiconductor substrate 1S and also cover side faces of the semiconductor substrate 1S exposed from the depressions 9 on the main surface of the semiconductor substrate.

Further, the lower end portions of the side walls 12A and 12B cover the main surface portions (upper surfaces of the depressions 9) of the semiconductor substrate 1S on both source and drain sides by amounts corresponding to the thicknesses (lengths d2 and d3 in FIG. 5) of the side walls 12A and 12B from side faces of the side walls 4A and 4B. The thicknesses (lengths d2 and d3 in FIG. 5) of the side walls 12A and 12B indicate the widths in the gate length direction of the lower ends of the side walls 12A and 12B.

In this embodiment, on the upper surface of the $n^+$-type semiconductor region 5Sp for source in the memory cell MC there is formed a silicide layer (first silicide layer) 7s whose end portion on the memory gate electrode MG side is defined by the side wall 12A. That is, the silicide layer 7s on the source side is formed self-alignmentwise for the side wall 12A. Therefore, the end portion on the memory gate electrode MG side of the source-side silicide layer 7s is spaced approximately a distance corresponding to the thickness (length d2 in FIG. 5) of the side wall 12 away from a junction surface (junction end) between the $n^-$-type semiconductor region 5Sm for source and the $n^+$-type semiconductor region 5Sp for source or from the junction surface (junction end) between the $n^+$-type semiconductor region 5Sp for source on the memory gate electrode MG side and the semiconductor substrate 1S.

As a result, even if the main surface of the source-side semiconductor substrate 1S is somewhat depressed or a convex portion is formed on the lower surface of the silicide layer 7s, an end portion of the silicide layer 7s and the convex portion are spaced away from the junction surface (junction end) between the $n^-$-type semiconductor region 5Sm for source and the $n^+$-type semiconductor region 5Sp for source. Consequently, even if the foregoing convex portion is formed on the lower surface of the silicide layer 7s, the convex portion is difficult to project to the outside of the $n^+$-type semiconductor region 5Sp.

In this way the leakage current IA flowing from the end portion of the silicide layer 7s toward the semiconductor substrate 1S which underlies the $n^-$-type semiconductor region 5Sm for source can be diminished or extinguished and hence it is possible to suppress or prevent the foregoing disturb defect caused by the leakage current IA. Consequently, it is possible to improve the reliability of operation of the semiconductor device having the non-volatile memory.

In this embodiment it is not that the n-type semiconductor region of a lower impurity concentration than the $n^+$-type semiconductor region 5Sp is formed at an end of the semiconductor region 5Sp as an anti-disturb defect measure, and therefore the problem of a short channel effect does not occur. Besides, since it is not that the surface of the side wall 4A opposed to the semiconductor substrate 1S is made longer as an anti-disturb measure, a lowering of the cell current does not occur, either.

In this embodiment, moreover, on the upper surface of the $n^+$-type semiconductor region 5Dp for drain in the memory cell MC there is formed a silicide layer (second silicide layer) 7d whose end portion on the control gate electrode CG is defined by the side wall 12B. That is, the drain-side silicide layer 7d is formed self-alignmentwise for the side wall 12B. Therefore, the end portion on the control gate electrode CG side of the drain-side silicide layer 7d is spaced a distance corresponding to the thickness (length d3 in FIG. 5) of the side wall 12B away from a junction surface (junction end) between the $n^-$-type semiconductor region 5Dm for drain and the $n^+$-type semiconductor region 5Dp for drain or from a junction surface (junction end) between the $n^+$-type semiconductor region 5Dp for drain and the semiconductor substrate 1S.

As a result, even if the main surface of the drain-side semiconductor substrate 1S is depressed or a convex portion is formed on a lower surface of the silicide layer 7d, an end portion of the silicide layer 7d and the foregoing convex portion are spaced away from the unction surface (junction end) between the $n^-$-type semiconductor region 5Dm for drain and the $n^+$-type semiconductor region 5Dp for drain or from the junction surface (junction end) between the $n^+$-type semiconductor region 5Sp for drain on the control gate electrode CG side and the semiconductor substrate 1S. Therefore, even if a convex portion is formed on the lower surface of the silicide layer 7d, the convex portion is difficult to project to the outside of the $n^+$-type semiconductor region 5Dp.

Consequently, the leakage current flowing from the end portion of the silicide layer 7d toward the semiconductor region 1S which underlies the $n^-$-type semiconductor region 5Dm for drain can be diminished or extinguished, whereby it is possible to avoid the problem of erroneous read in the semiconductor device having the non-volatile memory.

In this embodiment, as shown in FIG. 6, on the upper surface of the isolation region 10 there is formed a side wall (insulating film) 12C so as to cover the side face of the semiconductor region 1S (silicide layer 7s, 7d) exposed from the depression 11 which is formed in adjacency to an active region. For example, the side wall 12C is formed of silicon oxide like the side walls 12A and 12B.

With the side wall 12C, it is possible to suppress or prevent the silicide layer 7s (7d) from being extended in the thickness direction of the semiconductor substrate 1S along the side face of the isolation trench 10t in the portion of the semiconductor substrate 1S adjacent to the depression of the isolation region 10. Consequently, it is possible to diminish the leakage current flowing in the thickness direction of the semiconductor substrate 1S from the silicide layers 7s and 7d. That is, since the leakage current during stand-by of the semiconductor device having the non-volatile memory can be decreased, it is possible to diminish the power consumption.

Figure 7:
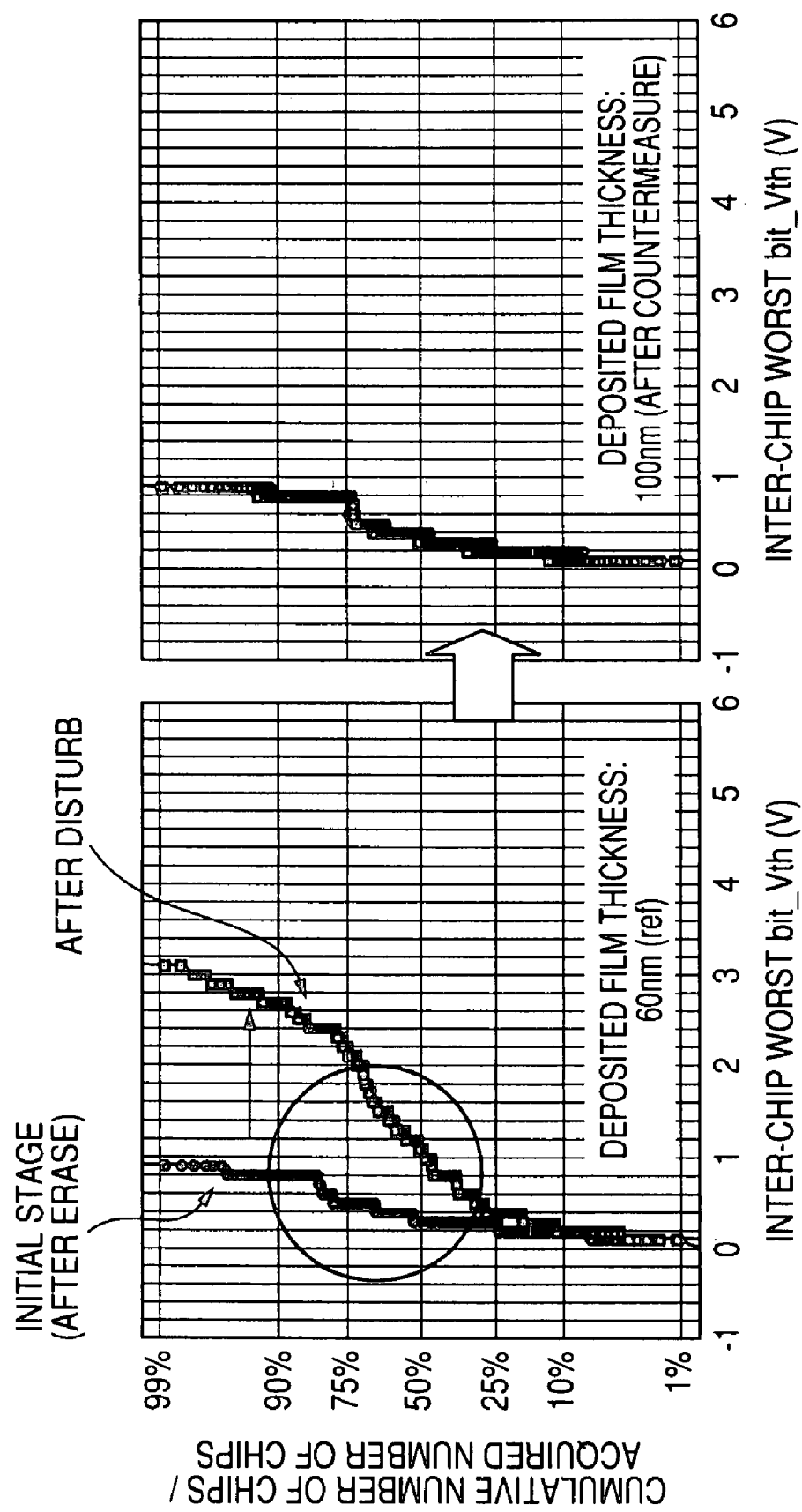
FIG. 7 is a graph showing a threshold voltage distribution within a semiconductor chip in a comparative manner between before taking a measure against a disturb defect and after taking the measure.

FIG. 7 shows the distribution of a threshold voltage Vth in a semiconductor chip in a comparative manner between before taking an anti-disturb defect measure and after taking the same measure.

The left side of FIG. 7 shows the state before taking the anti-disturb defect measure. The thickness at the time of deposition of an insulating film for forming the side walls 12A and 12B to be described later is about 60 nm for example. But in the memory cell MC, the insulating film is all removed and the side walls 12A and 12B are not formed. It is seen that in this case, as compared with the initial stage (just after erase), the threshold voltage Vth is largely shifted to the right due to disturb.

On the other hand, the right side of FIG. 7 shows the state after taking the anti-disturb defect measure. The side walls 12A and 12B are formed in the memory cell MC. It is seen that in this case the amount of shift of the threshold value Vth relative to the initial (just after erase) value is small in comparison with that in the state before taking the anti-disturb defect measure shown on the left side of FIG. 7. In this case, the thickness of the insulating film for forming the side walls 12A and 12B to be described later is about 100 nm for example, but by machining for forming the side walls the thickness (length d2, d3) of each of the side walls 12A and 12B is 10 to 80 nm for example. According to a study made by the present inventors, the thickness (length d2, d3) of each of the side walls 12A and 12B is required to be 10 nm or more, preferably 10 to 50 nm, for example.

Now, with reference to FIGS. 8 to 25, a description will be given about an example of a method for manufacturing the semiconductor device having the non-volatile memory according to this embodiment. FIGS. 8 to 25 are sectional views of principal portions during manufacture of the semiconductor device according to this embodiment. In those figures, the reference mark M denotes a memory region, P denotes a peripheral circuit region, RA and RB denote resistor regions. Although the memory region M, peripheral circuit region P and resistor regions RA, RB are shown in a separate manner, these are formed on one and same semiconductor substrate 1S.

Figure 8:
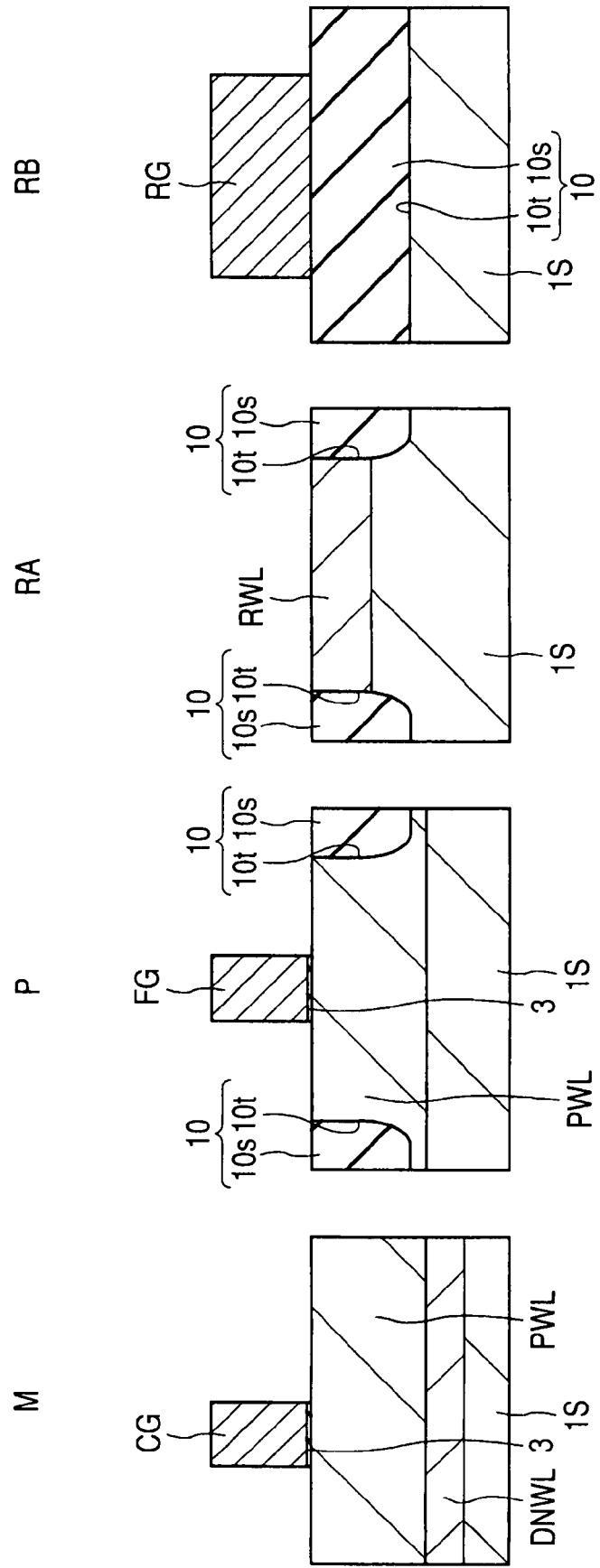
FIG. 8 is a sectional view of principal portions during manufacture of the semiconductor device having the non-volatile memory embodying the present invention.

First, as shown in FIG. 8, there is provided a semiconductor substrate 1S (here it is a thin semiconductor sheet of a generally circular shape in plan called a semiconductor wafer) having a main surface (first main surface, device-forming surface) and a back surface (second main surface), the main surface and the back surface being positioned on opposite sides in the thickness direction.

Subsequently, an isolation region 10 which defines an active region is formed on the main surface of the semiconductor substrate 1S. The isolation region 10 is formed by forming an isolation trench 10t on the main surface of the semiconductor substrate 1S and then embedding an insulating film 10s for isolation into the isolation trench 10t, the insulating film 10s being formed of silicon oxide for example.

Thereafter, an n-type buried well DNWL is formed in a memory region M. Then, a p-type well PWL is formed in the memory region M and the peripheral circuit region P. At this time, a resistor RWL is formed in the resistor region RA, the resistor RWL being formed by a p-type semiconductor region.

Next, a gate insulating film 3 of silicon oxide for example is formed on an active region of the main surface of the semiconductor substrate 1S, then a conductor film of low resistance polycrystalline silicon for example is deposited on the main surface of the semiconductor substrate 1S, and a cap insulating film of silicon oxide is deposited thereon.

Subsequently, a photoresist pattern is formed on the cap insulating film and, with the photoresist film as an etching mask, the cap insulating film exposed therefrom is etched to effect patterning of the cap insulating film, followed by removal of the photoresist pattern.

Thereafter, with the pattern of the remaining cap insulating film as an etching mask, the underlying conductor film exposed therefrom is etched to form a control gate electrode CG in the memory region M, a gate electrode FG in the peripheral circuit region P and a resistor RG in the resistor region RB. Then, the cap insulating film is removed.

Figure 9:
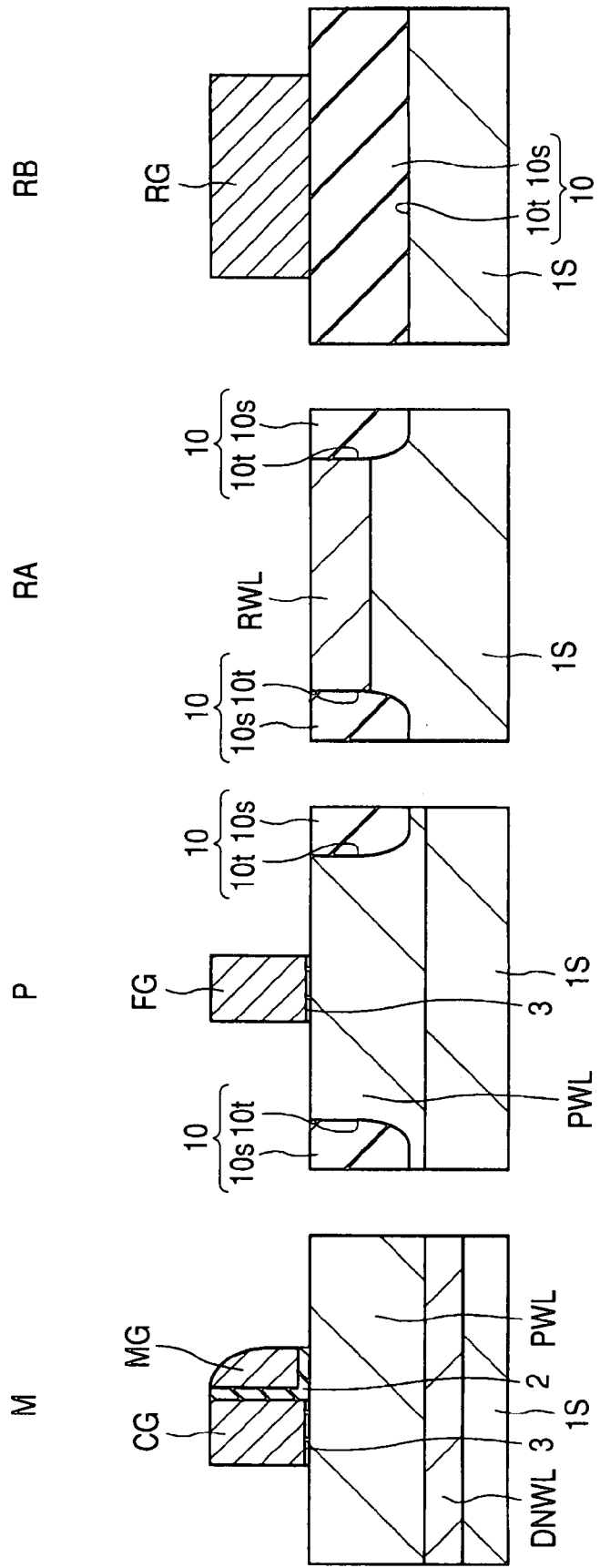
FIG. 9 is a sectional view of principal portions during manufacture of the semiconductor device which follows FIG. 8.

Subsequently, as shown in FIG. 9, an insulating film 2 for charge storage and a memory gate electrode MG are formed in the portion of the memory region M adjacent to the control gate electrode CG. Here this is done in the following manner for example.

First, an insulating film 2a of silicon oxide for example is deposited on the main surface of the semiconductor substrate 1S shown in FIG. 8 so as to also cover the surfaces of the control gate electrode CG, gate electrode FG and resistor RG. Thereafter, an insulating film 2b of silicon nitride for example is deposited on the insulating film 2a by chemical vapor deposition (CVD).

Subsequently, an insulating film 2c of silicon oxide for example is deposited on the insulating film 2b by a thermal oxidation method for example and then a conductor film of low resistance polycrystalline silicon for example is deposited thereon by CVD for example. Thereafter, the conductor film is etched by an etch back method for example, allowing the conductor film to remain on both side faces of the control gate electrode CG, gate electrode FG and resistor RG.

Next, there is formed such a photoresist pattern as covers the conductor film on one side face of the control electrode CG and permits the other film portion to be exposed and, with the photoresist pattern as an etching mask, the exposed conductor film is removed by etching, followed by removal of the photoresist pattern.

Subsequently, the insulating film 2 present on surfaces (upper surface and one side face) of the control gate electrode CG, surfaces (upper surface and both side faces) of the gate electrode FG, surfaces (upper surface and both side faces) of the resistor RG and the main surface of the semiconductor substrate 1S is removed.

In this way, in the memory region M, a memory gate electrode MG is formed via the insulating film 2 for charge storage on the main surface of the semiconductor substrate 1S in adjacency to the control gate electrode CG. The insulating film 2 is interposed on opposed side faces of the control gate electrode CG and the memory gate electrode MG to insulate the electrodes CG and MG from each other.

Figure 10:
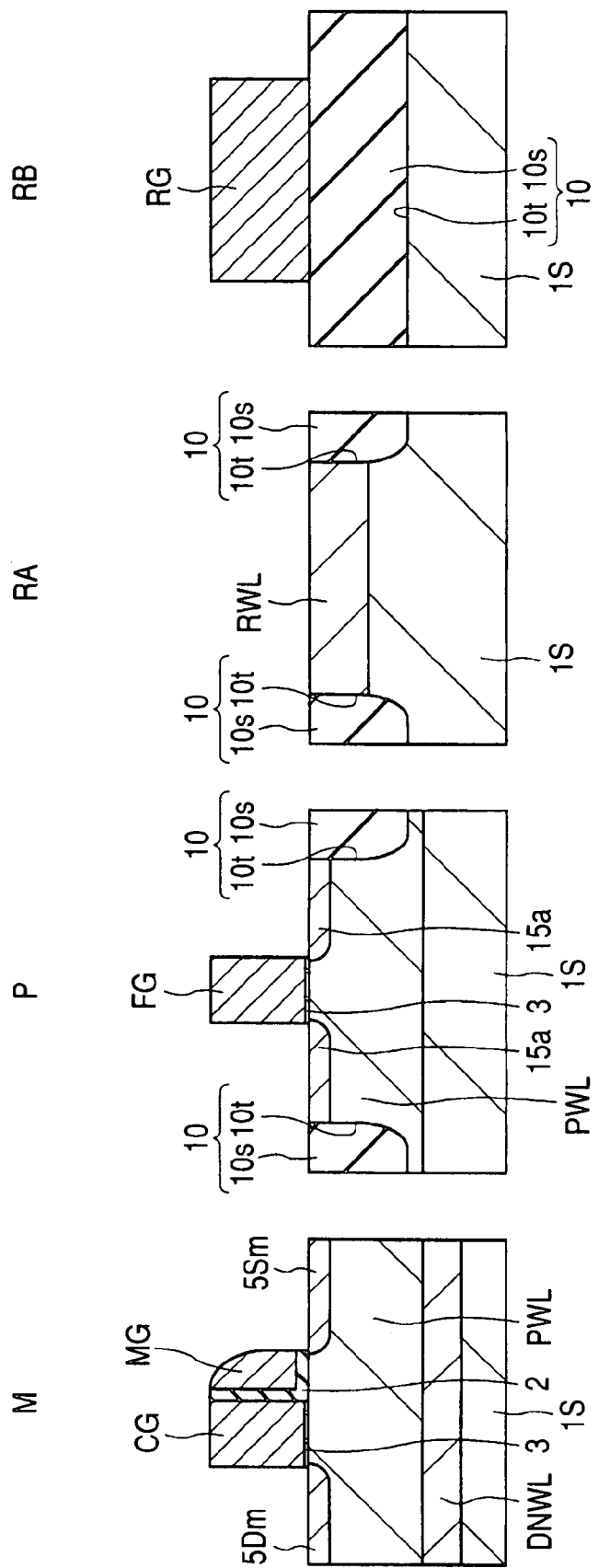
FIG. 10 is a sectional view of principal portions during manufacture of the semiconductor device which follows FIG. 9.

Next, as shown in FIG. 10, in the memory region M, an n$^-$-type semiconductor region 5Sm for source and an n$^-$-type semiconductor region 5Dm for drain are formed on the main surface of the semiconductor substrate 1S. Further, in the peripheral circuit region P, n$^-$-type semiconductor regions 15a for source and drain are formed on the main surface of the semiconductor substrate 1S. For example, this is done in the following manner.

The n$^-$-type semiconductor region 5Sm for source in the memory region M is formed by forming such a photoresist pattern as allows the source region and the memory gate electrode MG in the memory region M to be exposed onto the main surface of the semiconductor substrate 1S and covers the other portion and thereafter introducing an n-type impurity such as for example phosphorus (P) or arsenic (As) into the semiconductor substrate 1S by ion implantation for example. That is, the n⁻-type semiconductor region 5Sm for source is formed self-alignmentwise for a side face of the memory gate electrode MG.

The n⁻-type semiconductor region 5Dm for drain in the memory region M is formed by forming such a photoresist pattern as allows the drain region and the control gate electrode CG in the memory region M to be exposed onto the main surface of the semiconductor substrate 1S and covers the other portion and thereafter introducing an n-type impurity such as for example phosphorus or arsenic into the semiconductor substrate 1S by ion implantation for example. That is, the n⁻-type semiconductor region 5Dm for drain is formed self-alignmentwise for a side face of the control gate electrode CG.

The n⁻-type semiconductor regions 15a for source and drain are formed by forming such a photoresist pattern as allows the source and drain regions in the peripheral circuit region P to be exposed on the main surface of the semiconductor substrate 1S and covers the other portion and thereafter introducing an n-type impurity such as for example phosphorus or arsenic into the semiconductor substrate 1S by ion implantation for example. That is, the n⁻-type semiconductor regions 15a for source and drain are formed self-alignmentwise for side faces of the gate electrode FG.

Figure 11:
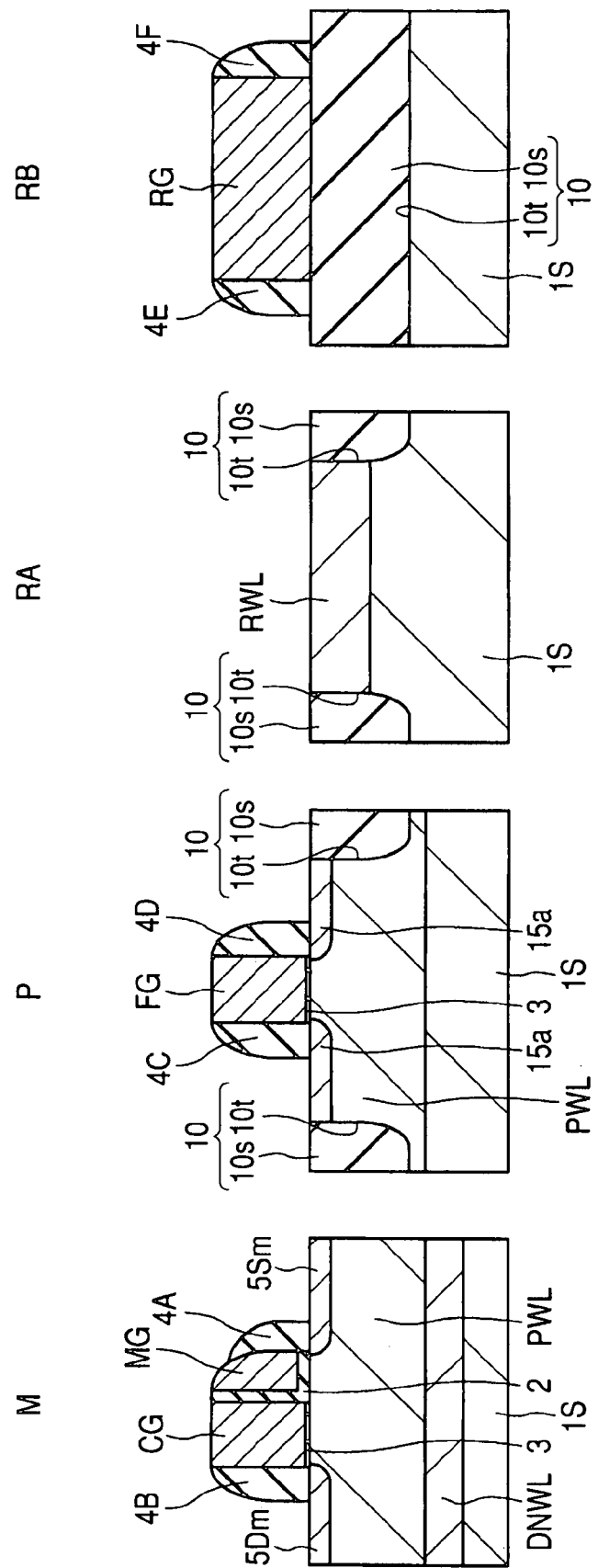
FIG. 11 is a sectional view of principal portions during manufacture of the semiconductor device which follows FIG. 10.

Next, an insulating film of silicon oxide for example is deposited onto the main surface of the semiconductor substrate 1S by CVD for example and is thereafter etched back to form side walls 4A, 4B, 4C, 4D, 4E and 4F of that insulating film on side faces of the memory gate electrode MG, control gate electrode CG, gate electrode FG and resistor RG, as shown in FIG. 11.

Figure 12:
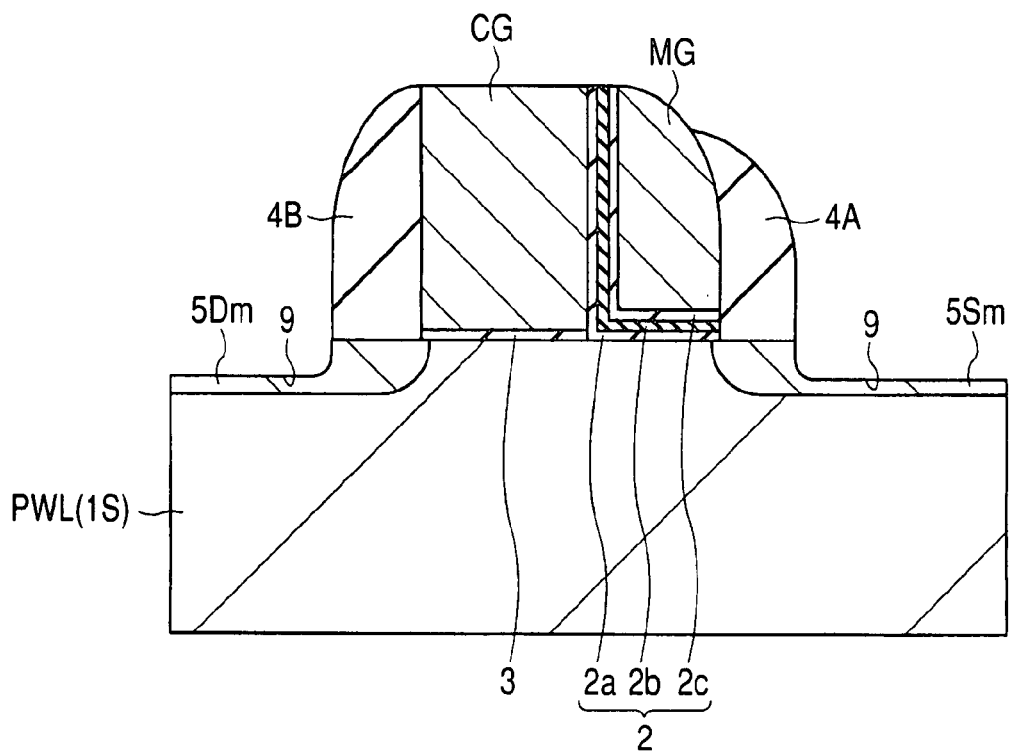
FIG. 12 is an enlarged sectional view of a memory region shown in FIG. 11.
Figure 13:
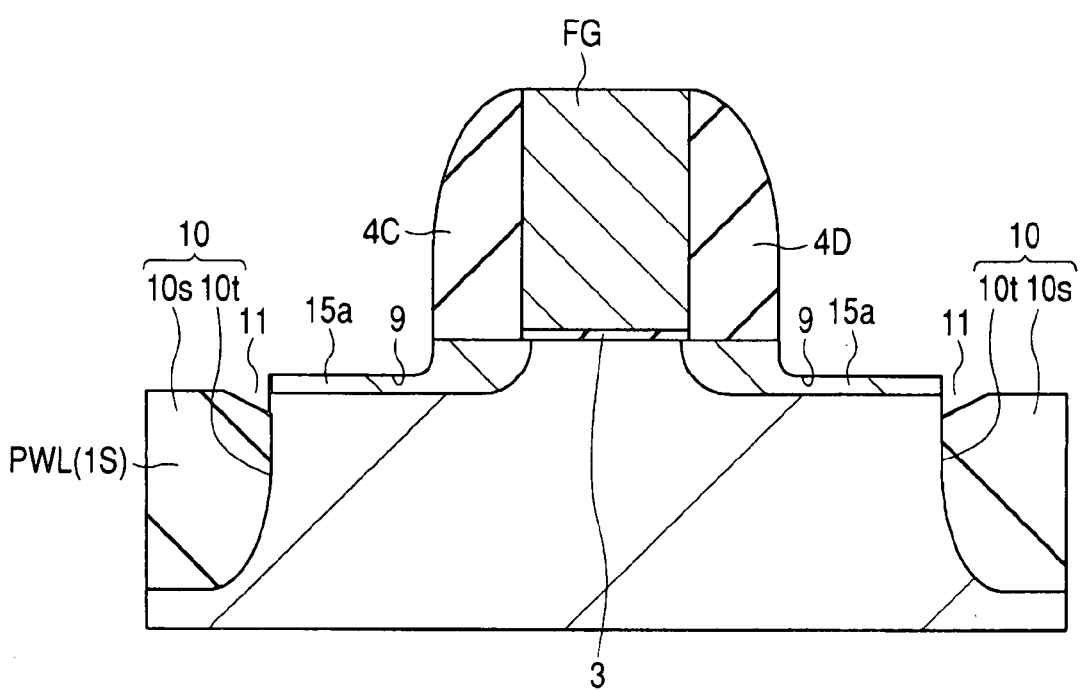
FIG. 13 is an enlarged sectional view of a peripheral circuit region shown in FIG. 11.
Figure 14:
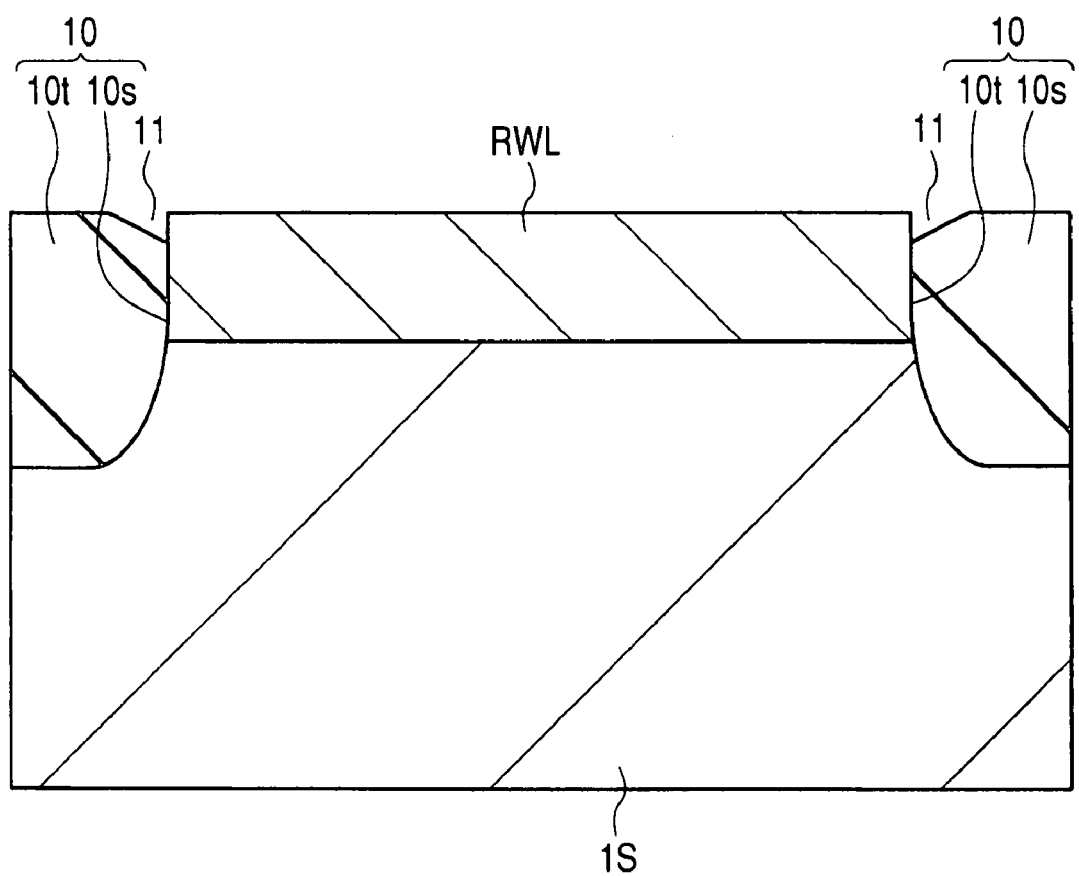
FIG. 14 is an enlarged sectional view of a resistor region shown in FIG. 11.

FIGS. 12 to 14 are enlarged sectional views of the memory region M, peripheral circuit region P and resistor region RA, respectively, shown in FIG. 11.

As shown in FIGS. 12 and 13, the main surface of the semiconductor substrate 1S in the region other than the region where the control gate electrode CG, memory gate electrode MG, gate electrode FG and side walls 4A to 4D formed on their side faces are disposed is etched. As a results depressions 9 are formed on the main surface of the semiconductor substrate 1S in the region other than the disposed region of the control gate electrode CG, memory gate electrode MG, gate electrode FG and side walls 4A to 4D formed on their side faces.

As shown in FIGS. 13 and 14, during manufacture of the semiconductor device, the upper surface of the insulating film 10s for isolation in the isolation region 10 is etched at its portions adjacent to the active region, whereby depressions 11 are formed in the portions of the upper surface of the insulating film 10s for isolation in the isolation region 10 adjacent to the active region.

Figure 15:
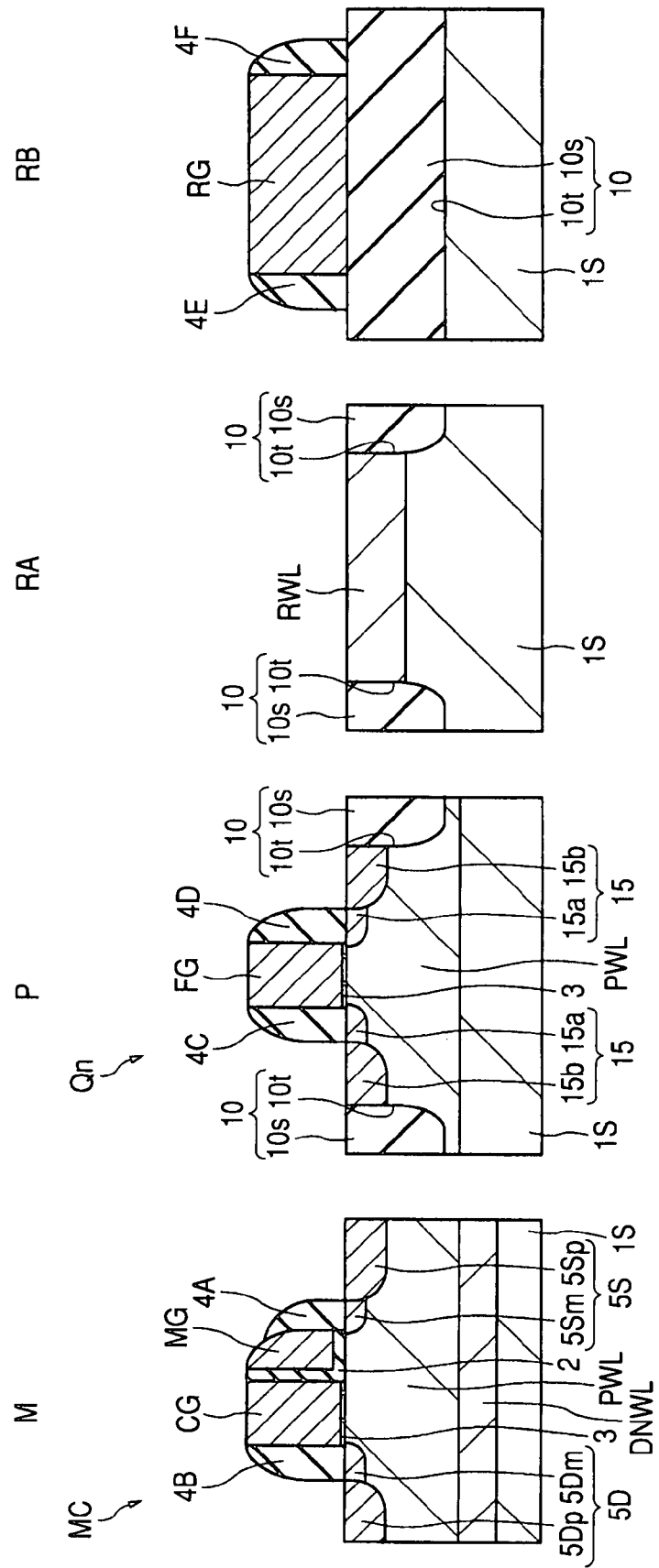
FIG. 15 is a sectional view of principal portions during manufacture of the semiconductor device which follows FIG. 11.

Next, as shown in FIG. 15, in the memory region M, an n⁺-type semiconductor region 5Sp for source and an n⁺-type semiconductor region 5Dp for drain are formed on the main surface of the semiconductor substrate 1S. Further, in the peripheral circuit region P, n⁺-type semiconductor regions 15b for source and drain are formed on the main surface of the semiconductor substrate 1S. For example, this is done in the following manner.

The n⁺-type semiconductor region 5Sp for source in the memory region M is formed by forming such a photoresist pattern as allows the source region and side wall 4A in the memory region M to be exposed onto the main surface of the semiconductor substrate 1S and closes the other portion and thereafter introducing an n-type impurity such as for example phosphorus or arsenic into the semiconductor substrate 1S by ion implantation for example. That is, the n⁺-type semiconductor region 5Sp for source is formed self-alignmentwise for a side face of the side wall 4A, whereby a semiconductor region 5S for source of the memory cell MC is formed in the memory region M.

The n⁺-type semiconductor region 5Dp for drain in the memory region M is formed by forming such a photoresist pattern as allows the drain region and side wall 4B in the memory region M to be exposed onto the main surface of the semiconductor substrate 1S and covers the other portion and thereafter introducing an n-type impurity such as for example phosphorus or arsenic into the semiconductor substrate 1S by ion implantation for example. That is, the n⁺-type semiconductor region 5Dp for drain is formed self-alignmentwise for a side face of the side wall 4B, whereby a semiconductor region 5D for strain of the memory cell MC is formed in the memory region M.

The n⁺-type semiconductor regions 15b for source and drain in the peripheral circuit region P are formed by forming such a photoresist pattern as allows the source region, drain region, gate electrode FG and side walls 4C, 4D in the peripheral circuit region P to be exposed onto the main surface of the semiconductor substrate 1S and thereafter introducing an n-type impurity such as for example phosphorus or arsenic into the semiconductor substrate 1S by ion implantation for example. That is, the n⁺-type semiconductor regions 15b for source and drain are formed self-alignmentwise for side faces of the side walls 4C and 4D, whereby semiconductor regions 15 for source and drain of an n-channel MISFETQn for forming a peripheral circuitry are formed in the peripheral circuit region P.

Figure 16:
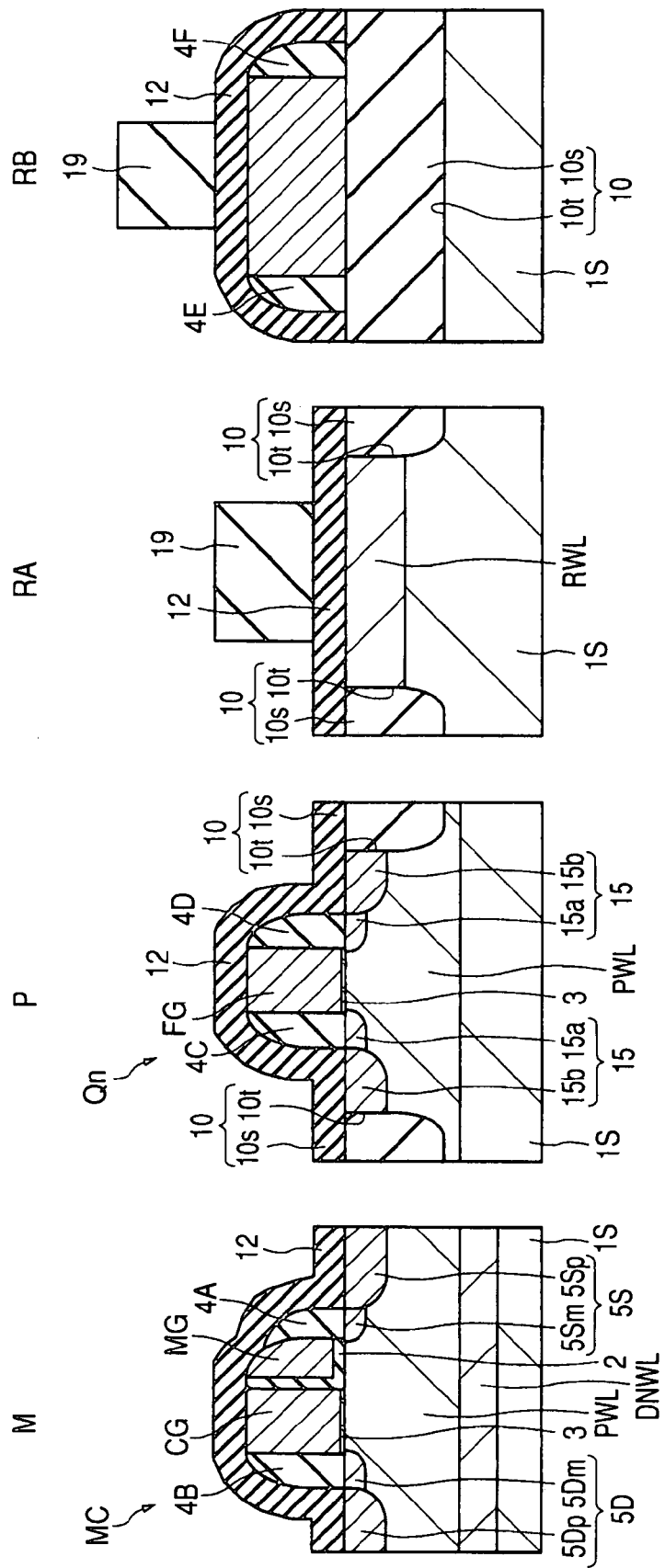
FIG. 16 is a sectional view of principal portions during manufacture of the semiconductor device which follows FIG. 15.

Next, as shown in FIG. 16, an insulating film 12 is deposited on the main surface of the semiconductor substrate 1S so as to also cover the surfaces of the control gate electrode CG, memory gate electrode MG, gate electrode FG, resistor RG and side walls 4A to 4F by CVD The insulating film 12 serves as a mask for inhibiting a silicide reaction in a silicide layer forming process to be described later and is formed of silicon oxide for example.

Subsequently, a photoresist pattern 19 is formed by the photolithography technique in the region where the insulating film 12 is to be retained and then, with the photoresist pattern 19 as an etching mask, the insulating film 12 is etched by anisotropic dry etching. Thereafter, the photoresist pattern 19 is removed.

Figure 17:
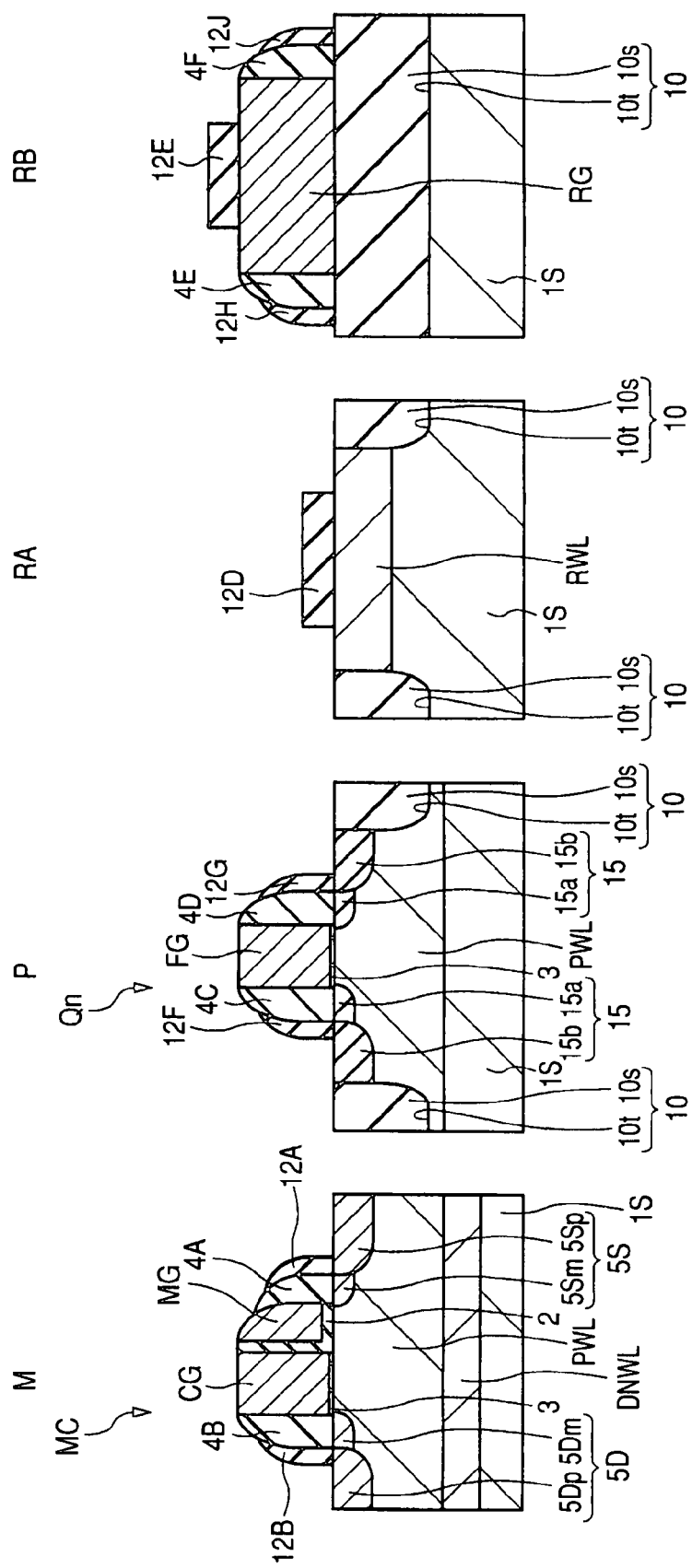
FIG. 17 is a sectional view of principal portions during manufacture of the semiconductor device which follows FIG. 16.

In this way, as shown in FIG. 17, there are formed patterns of insulating films 12D and 12E which serve as masks for inhibiting the reaction of a silicide layer in a silicide layer forming process to be described later. The insulating films 12D and 12E are formed so as to cover resistance value-forming regions of the resistors RWL and RG and allow electrode-forming regions to be exposed.

In this embodiment, during formation of the insulating regions 12D and 12E; side walls 12A and 12B are formed on side faces of the side walls 4A and 4B in the memory region M. At the same time, in the peripheral circuit region P, side walls 12F and 12G are formed on side faces of the side walls 4C and 4D. Also at the same time, in the resistor region RB, side walls 12H and 12J are formed on side faces of the side walls 4E and 4F. Further, at the same time, side walls 12C are formed on side faces of the depressions 12 formed on the upper surface of the isolation region 10.

Thus, in this embodiment, since the side walls 12A, 12B, 12C, 12F and 12G are formed in the same process as the process of forming the patterns of the insulating films 12D and 12E which serve as masks in the silicide layer forming process, the number of semiconductor device manufacturing steps does not increase despite the new addition (formation) of the side walls 12A, 12B, 12C, 12F and 12G.

Figure 18:
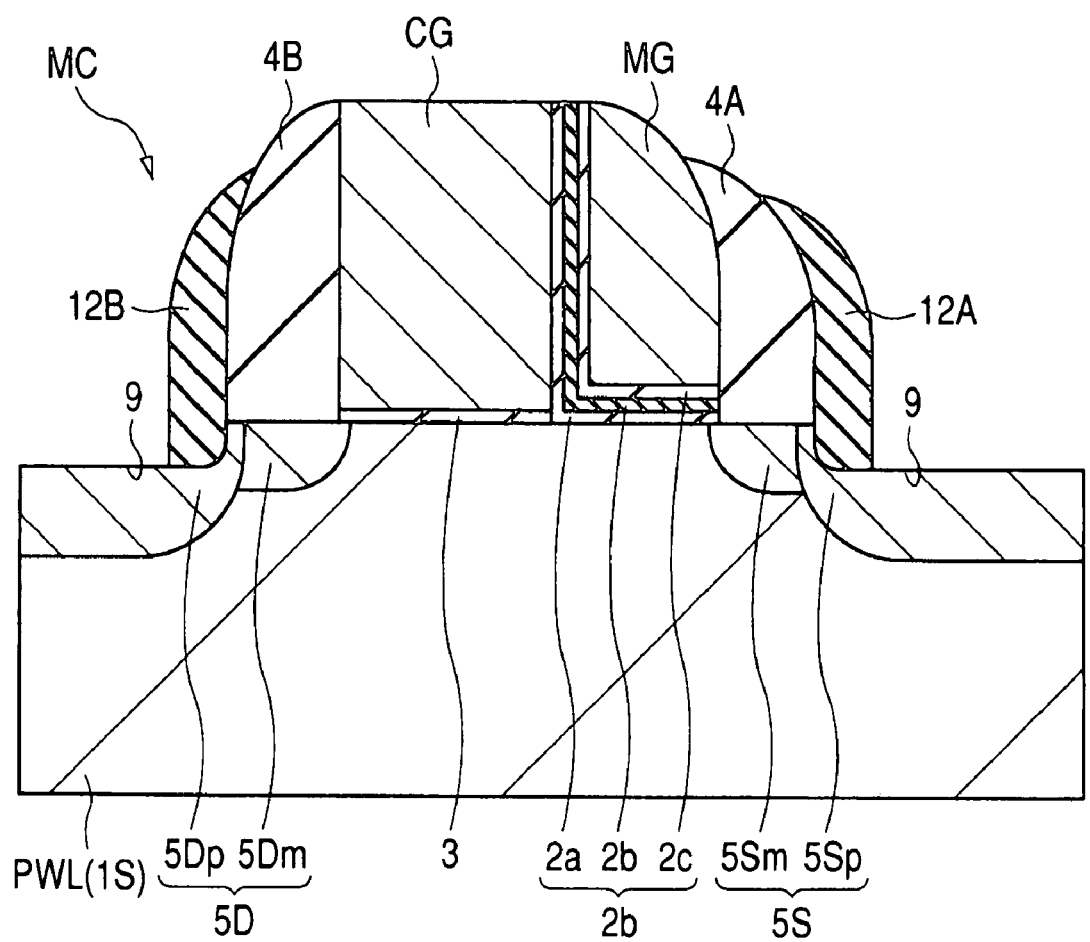
FIG. 18 is an enlarged sectional view of a memory region shown in FIG. 17.
Figure 19:
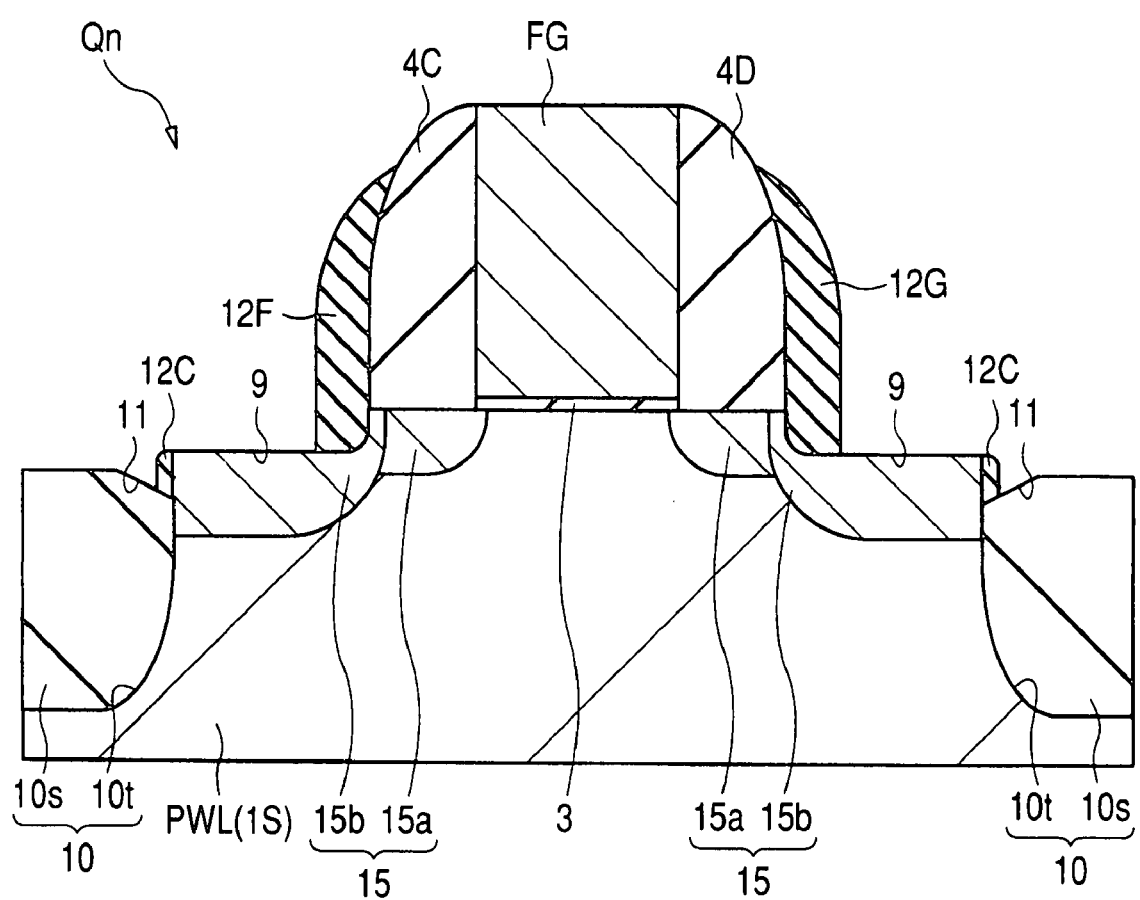
FIG. 19 is an enlarged sectional view of a peripheral circuit region shown in FIG. 17.
Figure 20:
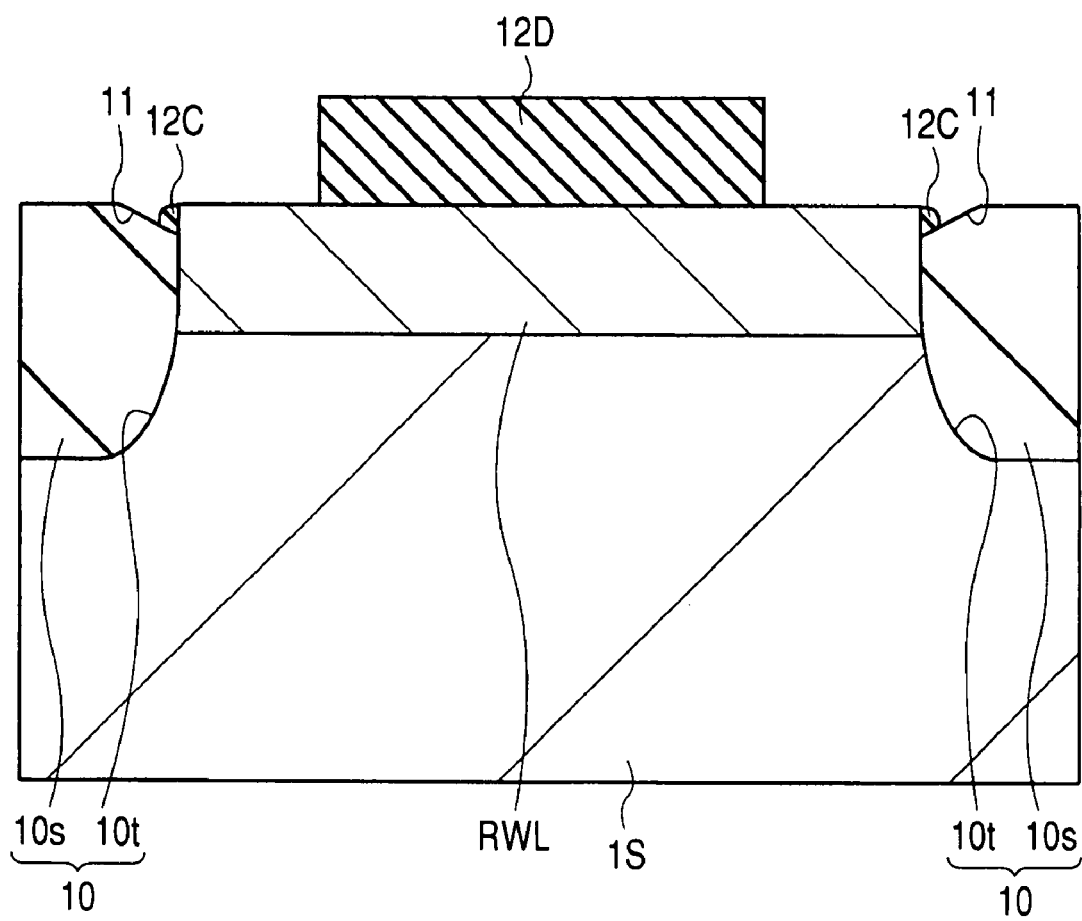
FIG. 20 is an enlarged sectional view of a resistor region shown in FIG. 17.

In this connection, reference is here made to FIGS. 18 to 20 which are enlarged sectional views of the memory region M, peripheral circuit region P and resistor region RA, respectively, shown in FIG. 17.

As shown in FIG. 18, the side walls 12A and 12B of the memory region M are formed so as to cover side faces of the side walls 4A and 4B. Lower end portions of the side walls 12A and 12B cover not only the edges of contact interfaces between the side walls 4A, 4B and the semiconductor substrate 1S but also the side faces of the semiconductor substrate 1S exposed from the depressions 9 of the semiconductor substrate on the source and drain sides.

Further, the lower end portions of the side walls 12A and 12B cover the main surface portions (upper surfaces of the depressions 9) of the semiconductor substrate 1S on the source and drain sides by an amount corresponding to the thickness of each of the side walls 12A and 12B from side faces of the side walls 4A and 4B. The end portions on the memory gate electrode MG and control gate electrode CG sides of the $n^+$-type semiconductor regions 5Sp and 5Dp for source and drain somewhat get in up to below the side walls 4A and 4B beyond the portions which underlie the side walls 12A and 12B.

As shown in FIG. 19, the side walls 12F and 12G in the peripheral circuit region P are formed so as to cover side faces of the side walls 4C and 4D. Lower end portions of the side walls 12F and 12G cover not only the edges of contact interfaces between the side walls 4C, 4D and the semiconductor substrate 1S but also the side faces of the semiconductor substrate 1S exposed from the depressions 9 of the semiconductor substrate on the source and drain sides.

Moreover, the lower end portions of the side walls 12F and 12G cover the main surface portions (upper surfaces of the depressions 9) of the semiconductor substrate 1S on the source and drain sides by an amount corresponding to the thickness of each of the side walls 12F and 12G from the side faces of side walls 4C and 4D. The end portions on the gate electrode FG side of the $n^+$-type semiconductor regions 15$b$ for source and drain somewhat get in up to below the side walls 4C and 4D beyond the portions which underlie the side walls 12F and 12G.

A side wall 12C is formed also on a side face of each depression 11 formed on an upper surface of the insulating film 10$s$ for isolation in the isolation region 10. The side wall 12C is formed by etching the insulating film 12 so as to cover the side face of the semiconductor substrate 1S exposed from the depression 11.

Next, the main surface of the semiconductor substrate 1S is, washed using a fluoric acid-based washing solution and a metallic film, e.g., a film of cobalt (Co), is deposited on the main surface of the semiconductor substrate 1S by for example sputtering so as to cover the surfaces of the control gate electrode CG, memory gate electrode MG, gate electrode FG, resistors RWL, RG, side walls 4A to 4F, 12A to 12C, 12F, 12G, 12H, 12J and insulating films 12D, 12E.

This metallic film is in contact not only with the $n^+$-type semiconductor regions 5Sp, 5Dp and 15$b$ of the semiconductor substrate 1S but also with upper surfaces of the control gate electrode CG, memory gate electrode MG and gate electrode FG and the electrode-forming regions of the resistors RWL and RG. However, as described earlier, the above metallic film is not in contact with side faces of the depressions 9 of the semiconductor substrate 1S formed on both sides of the control gate electrode CG and the memory gate electrode MG (both sides of the side walls 4A and 4B) because the side walls 4A and 4B are formed on those side faces respectively. The metallic film in question is not in contact with the side faces of the semiconductor substrate 1S, either, exposed from the depressions 11 formed on the upper surfaces of the isolation regions 10.

Subsequently, a heat treatment involving the conditions of, for example, a temperature of 400° to 550° C. and a duration of about one minute is applied to the semiconductor substrate 1S and the above metallic film, thereby inducing a silicidation reaction at the portions where the above metallic film is in contact with the semiconductor substrate 1S (the $n^+$-type semiconductor regions 5Sp, 5Dp, 15$b$ and the resistor RWL), gate electrode CG, memory gate electrode MG, gate electrode FG and resistor RG.

Figure 21:
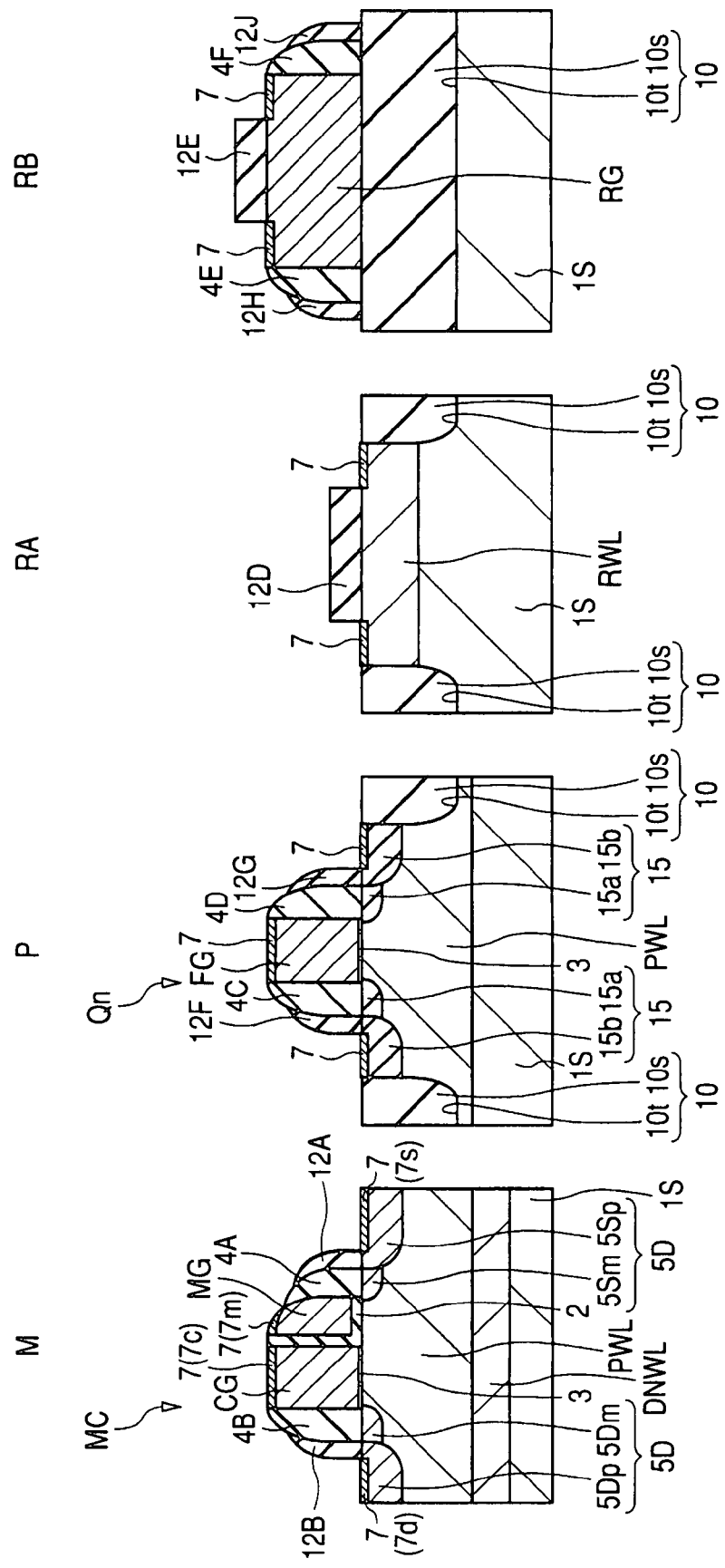
FIG. 21 is a sectional view of principal portions during manufacture of the semiconductor device which follows FIG. 17.

Thereafter, the metallic film which remains unreacted is removed by etching, thereby allowing a silicide layer 7 to remain on the upper surfaces of the semiconductor substrate 1S (the $n^+$-type semiconductor regions 5Sp, 5Dp, 15$b$ and the resistor RWL), control gate electrode CG, memory gate electrode MG, gate electrode FG and resistor RG, the silicide layer 7 comprising cobalt silicide ($CoSi_2$) for example, as shown in FIG. 21. Then, a heat treatment involving the conditions of, for example, a temperature of 700° to 800° C. and a duration of about one minute is applied to the semiconductor substrate 1S and the silicide layer 7 to make the silicide layer 7 low in resistance.

Figure 22:
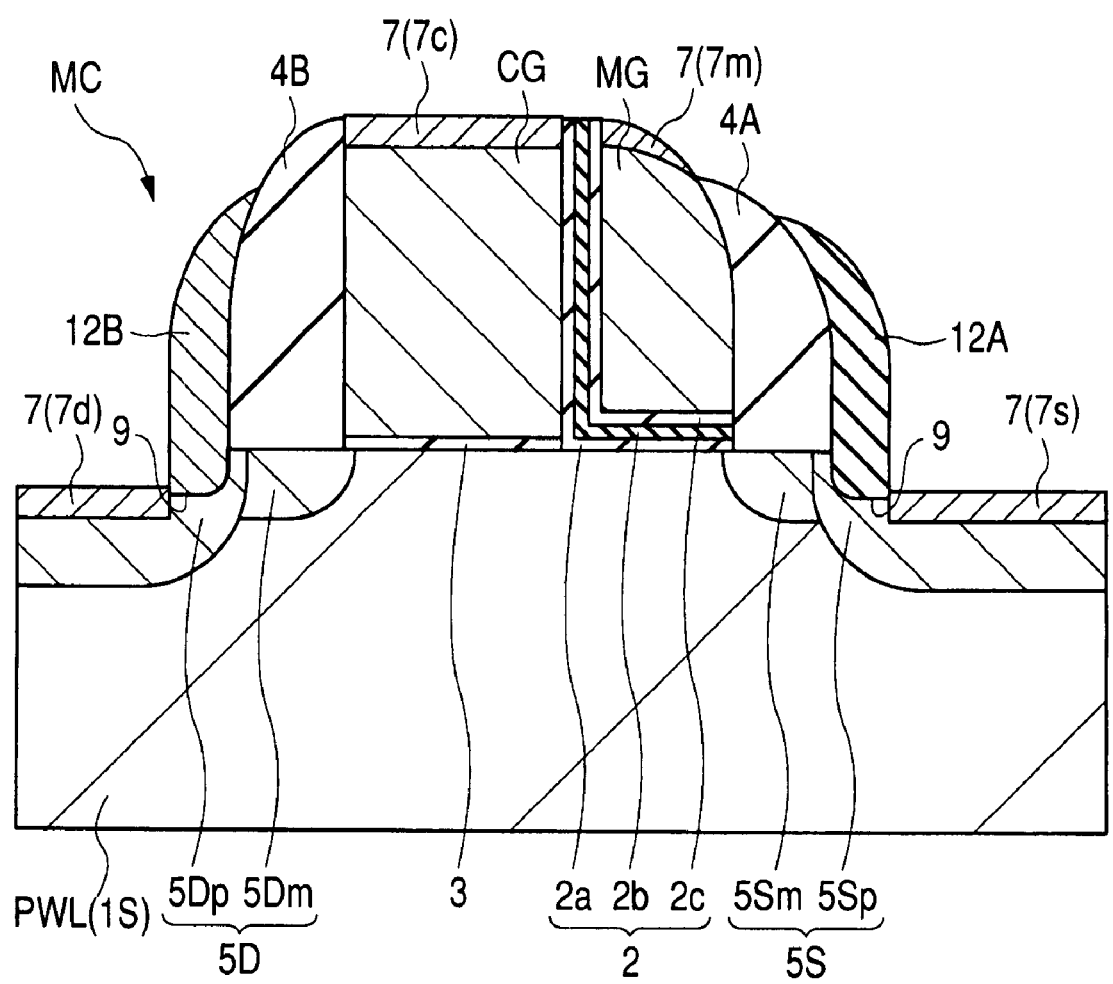
FIG. 22 is an enlarged sectional view of a memory region shown in FIG. 21.
Figure 23:
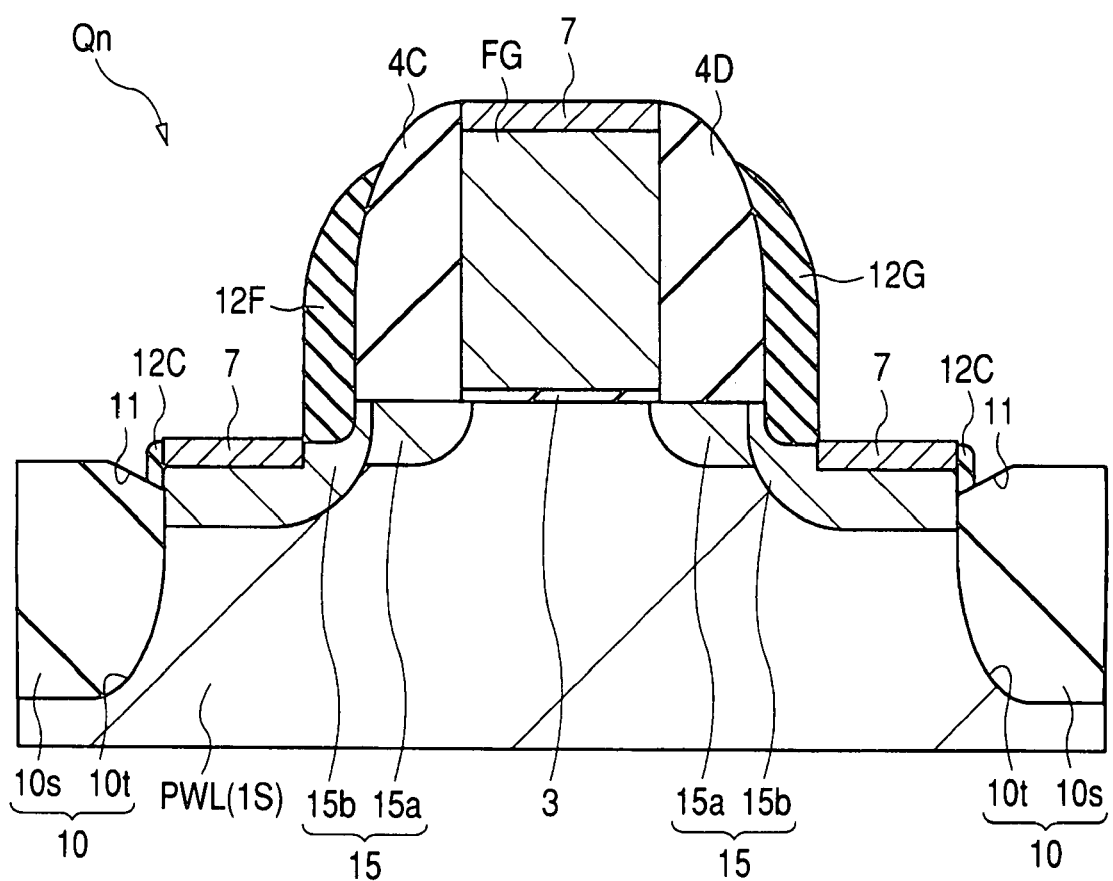
FIG. 23 is an enlarged sectional view of a peripheral circuit region shown in FIG. 21.
Figure 24:
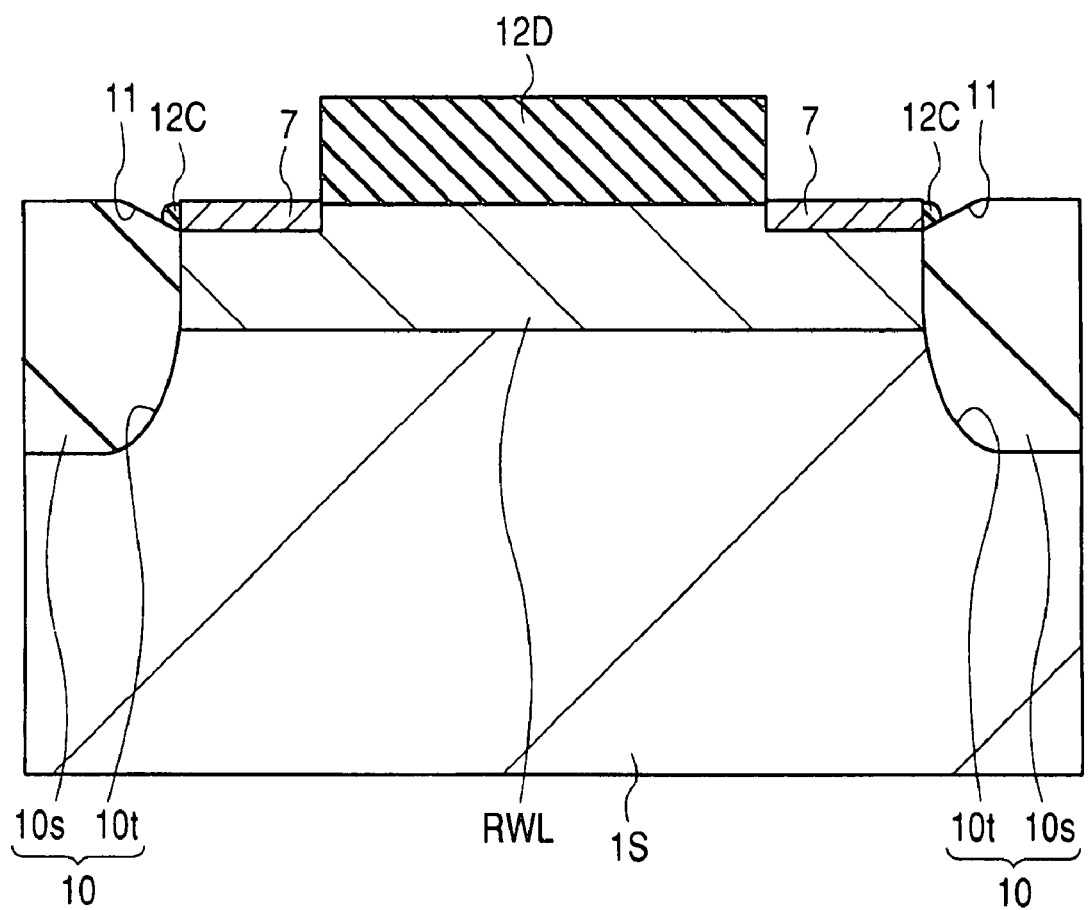
FIG. 24 is an enlarged sectional view of a resistor region shown in FIG. 21.

FIGS. 22 to 24 are enlarged sectional views of the memory region M, peripheral circuit region P and resistor region RA, respectively, shown in FIG. 21.

In this embodiment, a source-side silicide layer 7 (7$s$) is formed using the side wall 12A as a mask. That is, the silicide layer 7$s$ is formed self-alignmentwise for the side wall 12A. Therefore, as shown in FIG. 22, the end portion on the memory gate electrode MG side of the silicide layer 7$s$ is formed at a position spaced a distance corresponding to the thickness of the side wall 12A away from a side face of the side wall 4A. Thus, a spacing corresponding approximately to the thickness of the side wall 12A can be ensured between the end portion on the memory gate electrode MG side of the silicide layer 7$s$ and the junction surface (junction end) between the $n^-$-type semiconductor region 5Sm for source and the $n^+$-type semiconductor region 5Sp for source or the junction surface (junction end) between the $n^+$-type semiconductor region 5Sp for source on the memory gate electrode MG side and the semiconductor substrate 1S.

As a result, even if the main surface of the semiconductor substrate 1S on the source side is somewhat depressed or even if a convex portion is formed on a lower surface of the silicide layer 7$s$, the foregoing end portion of the silicide layer 7$s$ and the convex portion are spaced away from the junction surface (junction end) between the n-type semiconductor region 5Sm for source and the $n^+$-type semiconductor region 5Sp for source or the junction surface (junction end) between the $n^+$-type semiconductor region 5Sp for source and the semiconductor region 1S. Therefore, even if the aforesaid convex portion is formed on the lower surface of the silicide layer 7$s$, the convex portion is difficult to project to the outside of the $n^+$-type semiconductor region 5Sp.

Consequently, it is possible to diminish or extinguish the leakage current IA flowing from the end portion of the silicide layer 7$s$ toward the semiconductor substrate 1S which underlies the $n^-$-type semiconductor region 5Sm for source and hence possible to suppress or prevent the foregoing disturb defect caused by the leakage current IA. As a result, it is possible to improve the reliability of operation of the semiconductor device having the non-volatile memory.

In this embodiment, a drain-side silicide layer 7 (7d) is formed using the side wall 12B as a mask. That is, the silicide layer 7d is formed self-alignmentwise for the side wall 12B. Therefore, as shown in FIG. 22, the end portion on the control gate electrode CG side of the drain-side silicide layer 7 (7d) is formed at a position spaced a distance corresponding to the thickness of the side wall 12B from a side face of the side wall 4B. That is, a spacing corresponding approximately to the thickness of the side wall 12B is ensured between the end portion on the control gate electrode CG side of the silicide layer 7 (7d) and the junction surface (junction end) between the n$^-$-type semiconductor region 5Dm for drain and the n$^+$-type semiconductor region 5Dp for drain or the junction surface (junction end) between the n$^+$-type semiconductor region 5Dp for drain on the control gate electrode CG side and the semiconductor substrate 1S.

As a result, even if the main surface of the drain-side semiconductor substrate 1S is somewhat depressed or even if a convex portion is formed on a lower surface of the silicide layer 7d, the foregoing end portion of the silicide layer 7d and the convex portion are spaced away from the junction surface (junction end) between the n$^-$-type semiconductor region 5Dm for drain and the n$^+$-type semiconductor region 5Dp for drain or the junction surface (junction end) between the n$^+$-type semiconductor region 5Dp for drain on the control gate electrode CG side and the semiconductor region 1S. Therefore, even if the convex portion is formed on the lower surface of the silicide layer 7d, the convex portion is difficult to project to the outside of the n$^+$-type semiconductor region 5Dp.

Consequently, it is possible to diminish or extinguish the leakage current flowing from the end portion of the silicide layer 7d toward the semiconductor substrate 1S which underlies the n$^-$-type semiconductor region 5Dm for drain and hence possible to suppress or prevent the foregoing erroneous read defect caused by the leakage current. As a result, it is possible to improve the reliability of operation of the semiconductor device having the non-volatile memory.

In this embodiment, the silicide layers 7 are formed for source and drain of MISFETQn in the peripheral circuit region P, using the side walls 12F and 12G as masks. That is, the silicide layers 7 for source and drain of MISFETQn are formed self-alignmentwise for the side walls 12F and 12G. Therefore, as shown in FIG. 23, the end portions on the gate electrode FG side of the silicide layers 7 for source and drain are formed at positions spaced a distance corresponding to the thickness of each of the side walls 12F and 12G from side faces of the side walls 4C and 4D. That is, a spacing corresponding approximately to the thickness of each of the side walls 12F and 12G can be ensured between the end portion on the gate electrode FG side of each silicide layer 7 and the junction surface (junction end) between the n$^-$-type semiconductor region 15a for drain or the n$^+$-type semiconductor region 15b for drain or the junction surface (junction end) between the n$^+$-type semiconductor region 15b on the gate electrode FG side and the semiconductor substrate 1S.

As a result, even if the main surface portions of the semiconductor substrate 1S on the source and drain sides are somewhat depressed or even if a convex portion is formed on the lower surface of each silicide layer 7, the foregoing upper end portion of the silicide layer 7 and the convex portion are spaced away from the junction surface (junction end) between the n$^-$-type semiconductor region 15a for drain and the n$^+$-type semiconductor region 15b for drain or the junction surface (junction end) between the n$^+$-type semiconductor region 15b for drain on the gate electrode FG side and the semiconductor substrate 1S. Therefore, even if the convex portion is formed on the lower surface of the silicide layer 7 in MISFETQn, the convex portion is difficult to project to the outside of the n$^+$-type semiconductor region 15b.

Thus, in MISFETQn in the peripheral circuit region P, it is possible to diminish or extinguish the leakage current flowing from the end portion of the silicide layer 7 toward the semiconductor substrate 1S which underlies the n$^-$-type semiconductor region 15a for drain. Therefore, the leakage current during stand-by of the semiconductor device can be diminished and so can be the power consumption of the semiconductor device having the volatile memory.

In this embodiment, moreover, as shown in FIG. 24, since the side wall 12C is formed on the side face of the semiconductor substrate 1S exposed from the depression 11 on the upper surface of each isolation region 10, a silicidation reaction from the side face can be suppressed or prevented.

Consequently, in the portion of the semiconductor substrate 1S adjacent to the depression 11 in the isolation region 10, the silicide layer 7 can be suppressed or prevented from being extended in the thickness direction of the semiconductor substrate 1S along a side face of the isolation trench 10t. As a result, it is possible to diminish the leakage current flowing in the thickness direction of the semiconductor substrate 1S from the silicide layer 7. That is, since the leakage current during stand-by of the semiconductor device having the non-volatile memory can be diminished, it is possible to diminish the power consumption.

Figure 25:
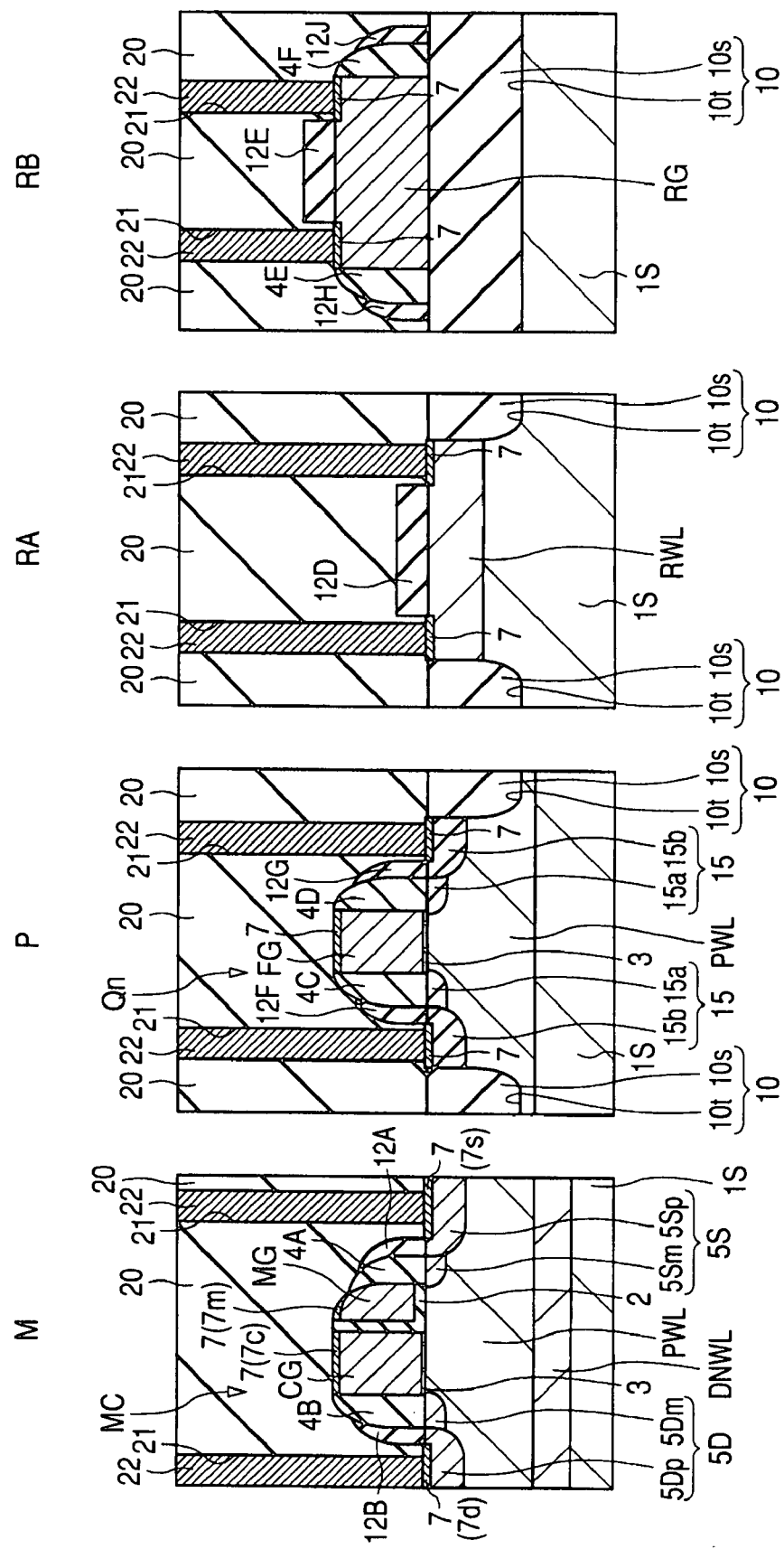
FIG. 25 is a sectional view of principal portions during manufacture of the semiconductor device which follows FIG. 21.

Next, as shown in FIG. 25, an insulating film 20 of silicon oxide for example is deposited on the main surface of the semiconductor substrate 1S by example CVD and subsequently there are formed contact holes 21 to which the upper surface of the silicide layer 7 is partially exposed.

Then, a barrier metal film of titanium nitride for example is deposited onto the insulating film 20 for example by both sputtering and CVD, thereafter, a main wiring metal film of tungsten for example is deposited onto the barrier metal film by for example CVD and these metal films are buried into the contact holes 21.

Thereafter, the metal films on the insulating film 20 are removed by chemical mechanical polishing (CMP) to form plugs 22 within the contact holes 21 respectively. Lower ends of the plugs 22 are in contact with and electrically coupled to the silicide layers 7.

The manufacture of the semiconductor device having the non-volatile memory is completed through subsequent, conventional wiring process, inspection process and assembling process.

Although the present invention has been described above by way of an embodiment thereof, it goes without saying that the present invention is not limited to the above embodiment, but that various changes may be made within the scope not departing from the gist of the invention.

For example, the insulating film for charge storage in the non-volatile memory is not limited to the silicon nitride film, but various changes may be made. For example, such a material or configuration as permits formation of an insulating trap level like alumina ($Al_2O_3$) may be used.

The present invention is applicable to the manufacturing industry for manufacturing semiconductor devices having a non-volatile memory.

What is claimed is:

1. A method of manufacturing a semiconductor device, comprising the steps of:

(a) forming an isolation region in a main surface of a semiconductor substrate such that an active region is defined by the isolation region;

(b) forming over the main surface of the semiconductor substrate an insulating film for charge storage of a non-volatile memory cell;

(c) forming over the insulating film for charge storage a first gate electrode having a first side face and a second side face, the first and second side faces being positioned at opposite sides of the first gate electrode in a direction along the main surface of the semiconductor substrate;

(d) forming in the main surface of the semiconductor substrate a first semiconductor region in a self-alignment manner with respect to the first side face of the first gate electrode;

(e) after the step (d), depositing a first insulating film over the main surface of the semiconductor substrate;

(f) after the step (e), etching the first insulating film and a surface of the first semiconductor region so as to form a first insulating film side wall over the first side face of the first gate electrode and a first depression in a region of the first semiconductor adjacent to the first insulating film side wall;

(g) after the step (f), forming in the main surface of the semiconductor substrate a second semiconductor region in a self-alignment manner with respect to a side face of the first insulating film side wall, the second semiconductor region being electrically coupled to the first semiconductor region;

(h) after the step (g), depositing a second insulating film over the main surface of the semiconductor surface;

(i) after the step (h), etching the second insulating film so as to form a second insulating film side wall over the side face of the first insulating film side wall and to cover a side surface of the semiconductor substrate exposed by the first depression; and (j) after the step (i), forming a first silicide layer over the second semiconductor region, the first silicide layer being formed in a self-alignment manner with respect to a side face of the second insulating film side wall.

2. A method according to claim 1, wherein step (i) includes:
forming an insulating film pattern which covers a region over the main surface of the semiconductor substrate, such that silicide is not formed over said region in step (j).

3. A method according to claim 1, wherein the step of forming the isolation region includes the steps of:
forming a trench in the main surface of the semiconductor substrate; and
burying an insulating film for isolation into the trench, and wherein the step (i) includes a step of:
forming a fifth insulating film side wall in a third depression, which is formed in a portion adjacent to the active region over an upper surface of the buried insulating film for isolation, so as to cover a side face of the semiconductor substrate exposed by the third depression.

4. A method according to claim 1, further comprising, before the step (b), the steps of:
forming a gate insulating film in a non-volatile memory cell region over the main surface of the semiconductor substrate; and
forming a second gate electrode over the gate insulating film, the second gate electrode having a third side face opposed to the second side face of the first gate electrode with the insulating film for charge storage therebetween and a fourth side face positioned opposite to the third side face in a direction along the main surface of the semiconductor substrate,
wherein step (d) includes forming a third semiconductor region over the main surface of the semiconductor substrate in a self-alignment manner with respect to the fourth side face of the second gate electrode,
wherein step (f) includes forming a third insulating film side wall over the fourth side face of the second gate electrode and etching a surface of the third semiconductor region so as to form a second depression in a region of the second semiconductor region adjacent to the third insulating film side wall,
wherein step (g) includes forming a fourth semiconductor region in the main surface of the semiconductor substrate in a self-alignment manner with respect to a side face of the third insulating film side wall, the fourth semiconductor region being electrically coupled to the third semiconductor region,
wherein step (i) includes forming a fourth insulating film side wall over the side face of the third insulating film side wall so as to cover a side surface of the semiconductor substrate exposed by the second depression, and
wherein step (j) includes forming a second silicide layer over the fourth semiconductor region in a self-alignment manner with respect to a side face of the fourth insulating film side wall.

5. A method according to claim 1, wherein a thickness of the second insulating film side wall is in the range of 10 to 80 nm.

6. A method according to claim 1, wherein step (b) includes:
(b1) forming over the main surface of the semiconductor substrate a fifth insulating film of silicon oxide;
(b2) after step (b1), forming over the main surface of the semiconductor substrate a sixth insulating film of silicon nitride; and
(b3) after step (b2), forming over the main surface of the semiconductor substrate a seventh insulating film of silicon oxide.

* * * * *